(12) United States Patent
Kolze

(10) Patent No.: US 8,601,338 B2
(45) Date of Patent: Dec. 3, 2013

(54) MODIFIED ERROR DISTANCE DECODING OF A PLURALITY OF SIGNALS

(75) Inventor: Thomas J. Kolze, Phoenix, AZ (US)

(73) Assignee: Broadcom Corporation, Irvine, CA (US)

(*) Notice: Subject to any disclaimer, the term of this patent is extended or adjusted under 35 U.S.C. 154(b) by 579 days.

(21) Appl. No.: 12/954,836

(22) Filed: Nov. 26, 2010

(65) Prior Publication Data

US 2011/0072330 A1 Mar. 24, 2011

Related U.S. Application Data

(63) Continuation-in-part of application No. 12/626,566, filed on Nov. 25, 2009, now Pat. No. 8,327,240.

(60) Provisional application No. 61/264,613, filed on Nov. 25, 2009, provisional application No. 61/118,343, filed on Nov. 26, 2008.

(51) Int. Cl.
*H03M 13/00* (2006.01)
*H03M 13/27* (2006.01)

(52) U.S. Cl.
USPC ............ 714/752; 714/758; 375/148; 375/267

(58) Field of Classification Search
USPC .................. 714/752, 755, 758; 375/148, 267
See application file for complete search history.

(56) References Cited

U.S. PATENT DOCUMENTS

| | | | | |
|---|---|---|---|---|
| 4,593,395 A | * | 6/1986 | Schouhamer Immink et al. | 714/755 |
| 5,430,739 A | * | 7/1995 | Wei et al. | 714/784 |
| 6,014,411 A | * | 1/2000 | Wang | 375/259 |
| 6,119,263 A | * | 9/2000 | Mowbray et al. | 714/781 |
| 7,436,895 B1 | * | 10/2008 | Tujkovic | 375/267 |
| 7,814,394 B2 | * | 10/2010 | Lee et al. | 714/758 |
| 7,876,243 B2 | * | 1/2011 | Mochizuki et al. | 341/94 |
| 8,281,215 B1 | * | 10/2012 | Ngo | 714/758 |
| 8,347,195 B1 | * | 1/2013 | Varnica et al. | 714/785 |

* cited by examiner

*Primary Examiner* — Joseph Schell
(74) *Attorney, Agent, or Firm* — Garlick & Markison; Shayne X. Short

(57) ABSTRACT

Modified error distance decoding. In certain communication systems, multiple signals (e.g., which may be viewed as being codewords, groups/sets of bits or symbols, etc.) can be commonly affected by such deleterious phenomenon as burst noise when traversing a communication channel (e.g., from a transmitter communication device to a receiver communication device). In such instances, a test error pattern may be identified which covers those affected bits (or symbols) among at least two respective signals (e.g., all of the respective signals or any subset thereof). Various respective test error patterns may be employed, each having a different respective weight, to the desired group of signals (e.g., codewords, groups/sets of bits or symbols, etc.). As such, more than one possible estimate of each respective signal may be generated. A variety of selection operations may be employed when more than one possible estimate exists (e.g., random selection, that estimate with minimum distance, etc.).

24 Claims, 14 Drawing Sheets communication system, using interleaving, with burst noise affected communication channel FIG. 7 brute force implementation of modified minimum distance decoder FIG. 8 alternative (1) implementation of modified minimum distance decoder CDMA (Code Division Multiple Access)

S-CDMA (Synchronous Code Division Multiple Access)

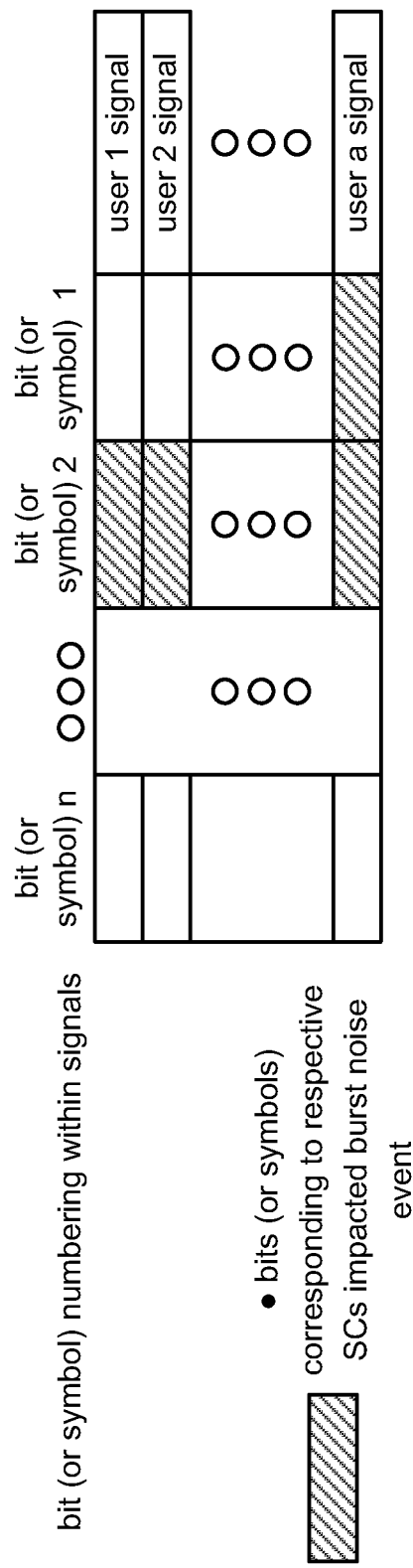

MODIFIED ERROR DISTANCE DECODING OF A PLURALITY OF SIGNALS

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional Patent Application which is hereby incorporated herein by reference in its entirety and made part of the present U.S. Utility patent application for all purposes:

1. U.S. Provisional Application Ser. No. 61/264,613, entitled "Modified error distance decoding for achieving improved performance in additive white Gaussian noise (AWGN) and burst events with interleaving," (filed Nov. 25, 2009, pending.

Continuation-in-part (CIP) Priority Claim, 35 U.S.C. §120

The present U.S. Utility patent application claims priority pursuant to 35 U.S.C. §120, as a continuation-in-part (CIP), to the following U.S. Utility patent application which is hereby incorporated herein by reference in its entirety and made part of the present U.S. Utility patent application for all purposes:

1. U.S. Utility application Ser. No. 12/626,566, entitled "Handling burst error events with interleaved Reed-Solomon (RS) codes," filed Nov. 25, 2009, pending, which claims priority pursuant to 35 U.S.C. §119(e) to the following U.S. Provisional Patent Applications which are hereby incorporated herein by reference in their entirety and made part of the present U.S. Utility patent application for all purposes:
   a. U.S. Provisional Application Ser. No. 61/118,343, entitled "Handling burst error events with interleaved Reed-Solomon (RS) codes," filed Nov. 26, 2008, now expired.
   b. U.S. Provisional Application Ser. No. 61/264,613, entitled "Modified error distance decoding for achieving improved performance in additive white Gaussian noise (AWGN) and burst events with interleaving," filed Nov. 25, 2009, pending.

Incorporation by Reference

The following U.S. Utility patent applications are hereby incorporated herein by reference in their entirety and made part of the present U.S. Utility patent application for all purposes:

1. U.S. Utility application Ser. No. 10/136,059, entitled "Chip blanking and processing in S-CDMA to mitigate impulse and burst noise and/or distortion," filed Apr. 30, 2002, now U.S. Pat. No. 7,236,545 B2, issued on Jun. 26, 2007, which claims priority pursuant to 35 U.S.C. §120, as a continuation-in-part (CIP), to the following U.S. Utility patent application which is hereby incorporated herein by reference in its entirety and made part of the present U.S. Utility patent application for all purposes:

2. U.S. Utility application Ser. No. 10/000,415, entitled "Detection and mitigation of temporary impairments in a communications channel," filed Nov. 2, 2001, now U.S. Pat. No. 7,308,050, issued on Dec. 11, 2007, which claims priority pursuant to 35 U.S.C. §119(e) to the following U.S. Provisional Patent Application which is hereby incorporated herein by reference in its entirety and made part of the present U.S. Utility patent application for all purposes:
   2. a. U.S. Provisional Application Ser. No. 60/296,884, entitled "Detection and mitigation of temporary impairments in a communications channel," filed Jun. 8, 2001, now expired.

3. U.S. Utility application Ser. No. 10/237,853, entitled "Detection and mitigation of temporary (bursts) impairments in channels using SCDMA,", filed Sep. 9, 2002, now U.S. Pat. No. 7,570,576 B2, issued on Aug. 4, 2009, which claims priority pursuant to 35 U.S.C. §120, as a continuation-in-part (CIP), to U.S. Utility application Ser. No. 10/000,415, now U.S. Pat. No. 7,308,050, which is also referenced above.

The U.S. Utility application Ser. No. 10/237,853, now U.S. Pat. No. 7,570,576 B2, issued on Aug. 4, 2009, also claims priority pursuant to 35 U.S.C. §119(e) to the following U.S. Provisional Patent Application which is hereby incorporated herein by reference in its entirety and made part of the present U.S. Utility patent application for all purposes:
   3. a. U.S. Provisional Application Ser. No. 60/402,776, entitled "Detection and mitigation of temporary (bursts) impairments in channels using SCDMA,", filed Aug. 12, 2002, now expired.

4. U.S. Utility application Ser. No. 10/962,803, entitled "Chip blanking and processing in SCDMA to mitigate impulse and burst noise and/or distortion," filed Oct. 12, 2004, now U.S. Pat. No. 7,366,258 B2, issued on Apr. 29, 2008, which claims priority pursuant to 35 U.S.C. §120, as a continuation-in-part (CIP), to U.S. Utility application Ser. No. 10/136,059, now U.S. Pat. No. 7,236,545 B2, issued on Jun. 26, 2007, which is also referenced above, which claims priority pursuant to 35 U.S.C. §120, as a continuation-in-part (CIP), to U.S. Utility application Ser. No. 10/000,415, now U.S. Pat. No. 7,308,050, issued on Dec. 11, 2007, which is also referenced above.

5. U.S. Utility application Ser. No. 10/112,009, entitled "Modified branch metrics for processing soft decisions to account for phase noise impact on cluster variance," filed Mar. 30, 2002, now U.S. Pat. No. 7,136,435 B2, issued on Nov. 14, 2006.

6. U.S. Utility application Ser. No. 10/175,330, entitled "System, method, and computer program product for mitigating burst noise in a communications system," filed Jun. 20, 2002, now U.S. Pat. No. 7,631,242, issued on Dec. 8, 2009, which claims priority pursuant to 35 U.S.C. §119(e) to the following two (2) U.S. Provisional Patent Applications which are hereby incorporated herein by reference in their entirety and made part of the present U.S. Utility patent application for all purposes:
   6. a. U.S. Provisional Application Ser. No. 60/308,101, entitled "FEC block reconstruction method, system and computer program product for mitigating burst noise,", filed Jul. 30, 2001, now expired.
   6. b. U.S. Provisional Application Ser. No. 60/299,768, entitled "Method system and computer program product for mitigating burst noise," filed Jun. 22, 2001, now expired.

7. U.S. Utility application Ser. No. 10/112,009, entitled "Modified branch metrics for processing soft decisions to account for phase noise impact on cluster variance," filed Mar. 30, 2002, now U.S. Pat. No. 7,136,435 B2, issued on Nov. 14, 2006.

BACKGROUND OF THE INVENTION

1. Technical Field of the Invention

The invention relates generally to communication systems; and, more particularly, it relates to performing modified error distance decoding of more than one signal being affected by a common deleterious effect such as burst noise, distortion, etc.

2. Description of Related Art

Data communication systems have been under continual development for many years. Generally speaking, a data communication system may be viewed as supporting the transmission of any of a variety of types of information (e.g., data, voice, media, etc.) from a first location to a second location within such a communication system. Communication systems are known to support wireless and wire lined communications between wireless and/or wire lined communication devices. Also generally speaking, within the context of communication systems that employ various types of communication devices, there is a first communication device at one end of a communication channel with encoder capability and second communication device at the other end of the communication channel with decoder capability. In many instances, one or both of these two communication devices includes encoder and decoder capability (e.g., within a bi-directional communication system). Transferring information from one location to another can be applied generally within any type of communication system, including those that employ some form of data storage (e.g., hard disk drive (HDD) applications and other memory storage devices) in which data is processed and/or encoded before writing to the storage media, and then the data is processed and/or decoded after being read/retrieved from the storage media.

Certain communication systems employ one or more of various types of coding (e.g., error correction codes (ECCs) and/or forward error correction (FEC) codes whose decoding may be performed iteratively) to ensure that the data extracted from a signal received at one location of a communication channel is the same information that was originally transmitted from another location of the communication channel. Communications systems with iterative codes are often able to achieve lower bit error rates (BER) than alternative codes for a given signal to noise ratio (SNR).

In addition, any of a variety of types of communication systems may employ one or more of various types of signaling (e.g., orthogonal frequency division multiplexing (OFDM), code division multiple access (CDMA), synchronous code division multiple access (S-CDMA), time division multiple access (TDMA), etc.) to allow more than one user access to the communication system. Such signaling schemes may generally be referred to as multiple access signaling schemes.

In accordance with processing signals transmitted across a communication channel within such communication systems, sometimes more than one signal is affected by a common deleterious effect such as burst noise, distortion, etc. That is to say, such a deleterious effect can affect more than one signal similarly. The prior art does not adequately provide for means to address and overcome such deleterious effects as may be incurred among multiple signals within a communication system.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 14 is a diagram illustrating an embodiment of different respective bit (or symbols) in accordance with S-CDMA signaling being undesirable affected by burst noise, distortion, and/or other deleterious effects.

DETAILED DESCRIPTION OF THE INVENTION

Figure 1:
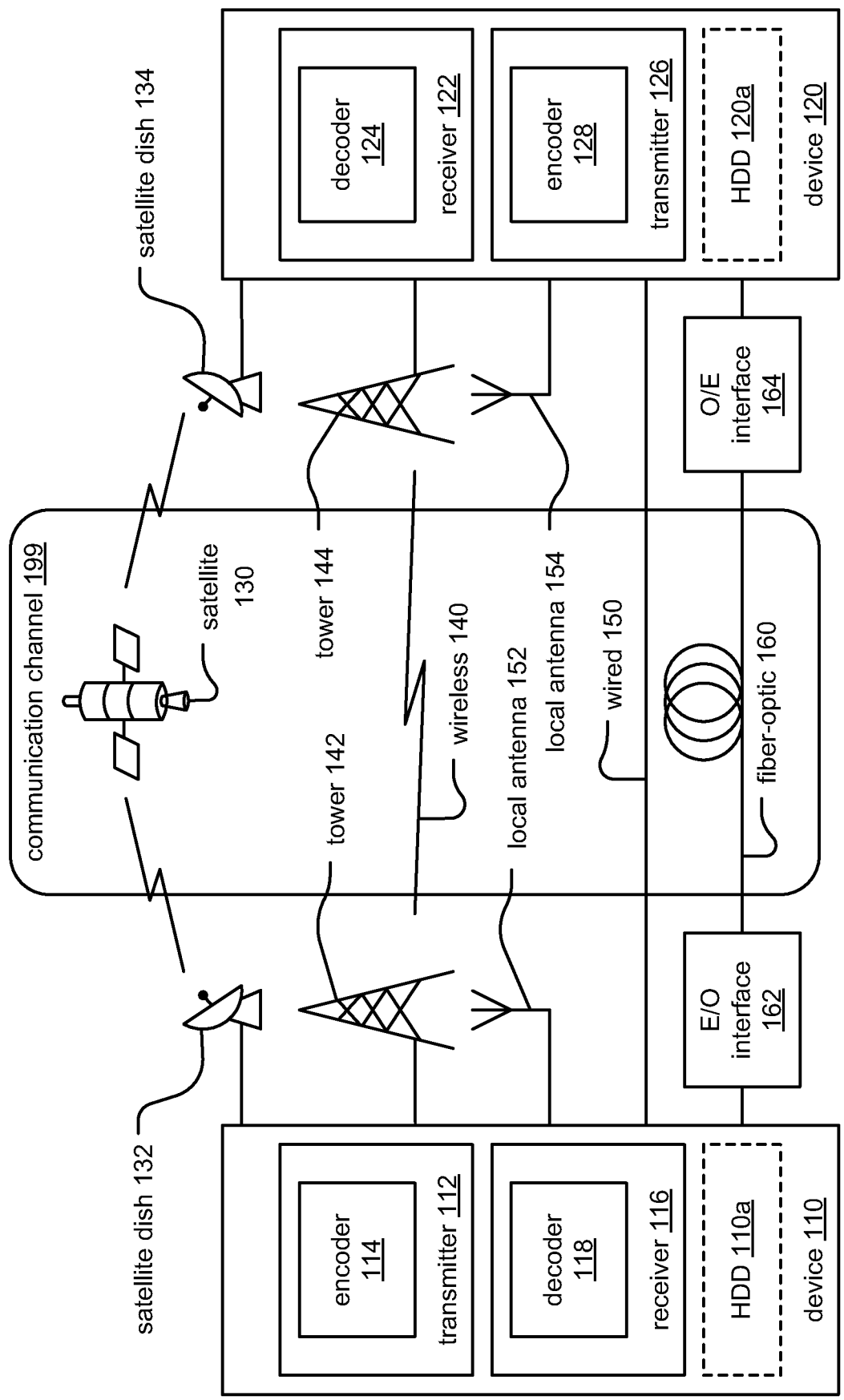
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
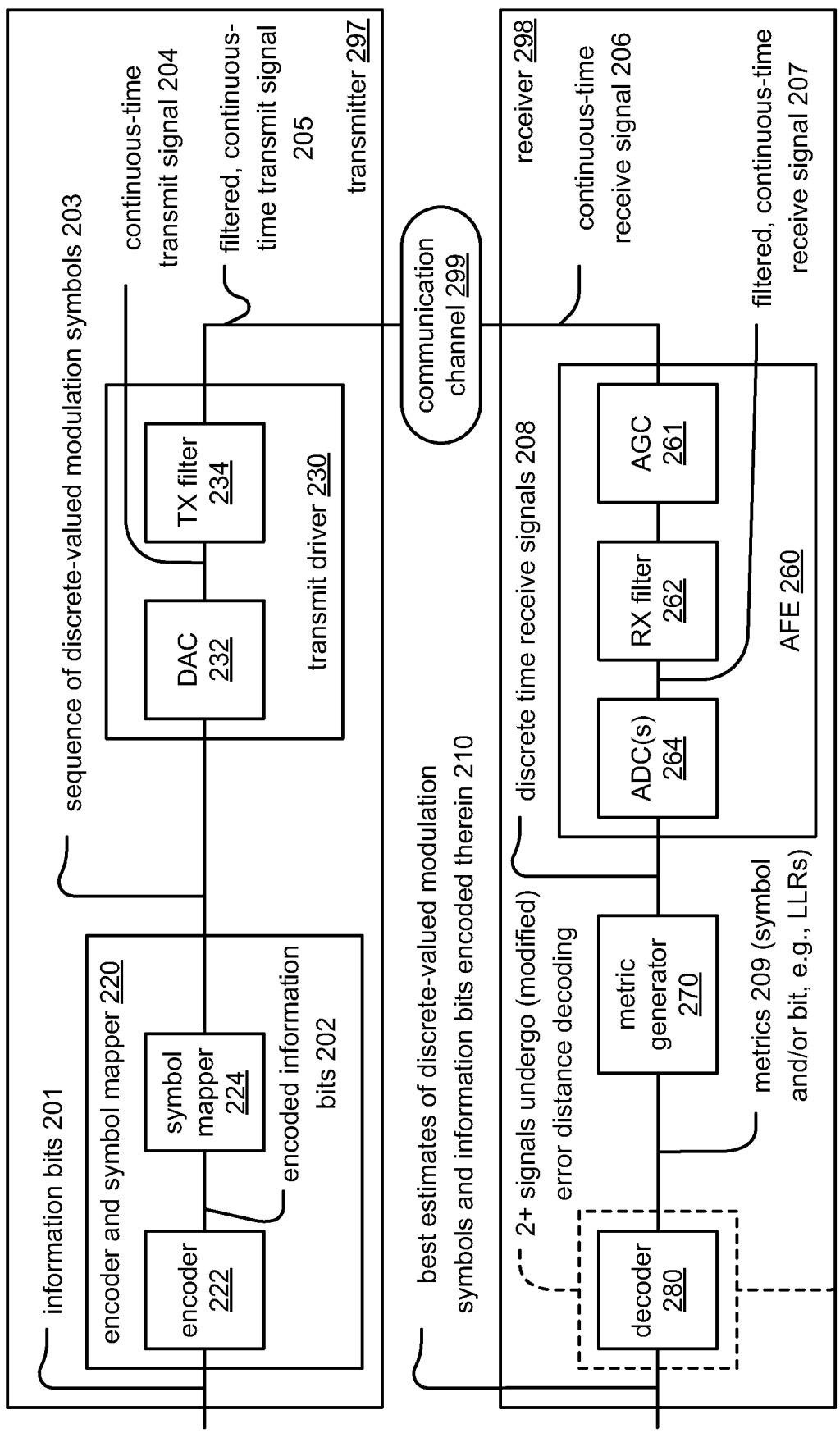

FIG. 1 and FIG. 2 are diagrams illustrate various embodiments of communication systems, respectively.

Referring to FIG. 1, this embodiment of a communication system is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

Either one of both of the communication device 110 and the communication device 120 can include a hard disk drive (HDD) (or be coupled to a HDD). For example, the communication device 110 can include a HDD 110a, and the communication device 120 can include a HDD 120a.

In some instances, to reduce transmission errors that may undesirably be incurred within a communication system, error correction and channel coding schemes are often employed (e.g., sometimes generally referred to as forward error correction (FEC) codes, error correction codes (ECCs), etc. and can include any one or combination of a variety of such codes as convolutional codes, turbo codes, turbo trellis coded modulation (TTCM), Reed-Solomon (RS) codes, LDPC (Low Density Parity Check) codes, etc.).

Generally, these error correction and channel coding schemes involve the use of an encoder at the transmitter and a decoder at the receiver. Clearly, a given communication device may include both an encoder and a decoder to effectuate bi-directional communication with one or more other communication devices; in other embodiments, a given communication device includes only encoding functionality (e.g., a transmitter type communication device) or only decoding functionality (e.g., a receiver type communication device).

Any of the various types of signal processing operations and means described herein, and their equivalents, can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit (TX) filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes an automatic gain control (AGC) circuit or module 261, a receive (RX) filter 262 (that generates a filtered, continuous-time receive signal 207) and one or more ADCs (Analog to Digital Converters) 264 (that generates discrete-time receive signals 208). The ADC(s) 264 may be viewed as incorporating imbalance and distortion cancellation/compensation functionality in accordance with the principles and/or aspects of the invention presented herein; such functionality may be directed to embodiments including two or more ADCs. Greater details are provided herein regarding various means by which such imbalance and distortion cancellation may be effectuated. A metric generator 270 calculates metrics 209 (e.g., on either a symbol and/or bit basis) that are employed by a decoder 280 to make best estimates of the discrete-valued modulation symbols and information bits encoded therein 210. The decoder 280 may be a forward error correction (FEC) decoder employing any of a variety of error correction codes (ECCs).

As the reader will understand, various aspects and principles of the invention are operative to mitigate the effects of deleterious effects that may be incurred by one or more signals when traversing or being communicated via a communication channel. Such deleterious effects may include burst noise and/or any other distortions, impairments, etc. that may be incurred as related to an imperfect (i.e., real) communication channel in such communication systems. By mitigating such deleterious effects in accordance with the aspects or principles presented herein, the decoder 280 is able to correct more (if not all) errors thereby reducing the number of uncorrected errors.

The processing of received signals of either of the previous embodiments may be implemented to include various aspects and/or embodiment of the invention therein (e.g., modified error distance decoding). In addition, several of the following Figures describe other and particular embodiments (some in more detail) that may be used to support the devices, systems, functionality and/or methods that may be implemented in accordance with certain aspects and/or embodiments of the invention.

In accordance with the various aspects and principles of the invention, a novel decoding approach is presented herein by which improved performance (e.g., lower error rates) may be achieved in the presence of burst error events, distortion, and/or other deleterious effects. Any communication system implementation in which multiple signals may undesirably be commonly affected by such a deleterious effect (e.g., burst error noise, distortion, etc.) may operate in accordance with the various aspect and principles, and their respective equivalents, of the invention.

As one particular example, a communication system that operates in accordance with interleaved codes, multiple received signals (e.g., initial estimates of codewords, for example, a received codeword may be a) the initially estimated received signal, prior to error correction decoding, which is the transmitted codeword possibly influenced by noise and/or any other impairment, and thus is literally in general not a codeword, or b) the initially estimated received signal after a successful application of a conventional decoding attempt applied to an individual received codeword), may be commonly affected by such a deleterious effect. Additionally, the multiple received codewords may be provided by the output of decoding or partial decoding of inner codes in a concatenated coding scheme, such as ITU-J.83B). The techniques presented herein include application to block interleaved codewords. Analogous such principles may also be employed to address adaptation for convolutionally interleaved codewords (e.g., as described within U.S. Utility application Ser. No. 12/626,566, entitled "Handling burst error events with interleaved Reed-Solomon (RS) codes", referenced above). The aspects and principles, and their equivalents, presented herein are applicable to any type of coding scheme, including cyclic coding and non-cyclic coding, standard-length Reed-Solomon (RS) codewords, shortened and extended RS codewords, and Hamming codes (including extended and shortened Hamming codes). The novel approach to performing decoding in the presence of such deleterious effects (e.g., burst error noise, distortion, etc.) may be applied to convolutionally encoded codewords including those communication systems that include interleaving therein.

In accordance with this novel decoding and processing, a partial decoding or series of partial decoding iterations/operations may be used as an aid in identifying where communication channel degradation has occurred in relation to the received bits, symbols, symbols included within a RS codeword, an LDPC (Low Density Parity Check) codeword, etc. (e.g., or a codeword as generated in accordance with any other type of code type). Again, one type of such communication channel degradation may be related to communication systems deleteriously suffering from burst error noise.

Various aspects and principles of the invention as presented herein, along with many variations and equivalents, for such partial decoding(s) and subsequent identification of burst noise-impacted bits or symbols are presented herein. In accordance with this novel decoding approach, subsequent processing of "known" error locations may provide additional benefits in accordance with such decoding.

Generally speaking, the reader can appreciate that "channel degradation" and "burst noise" include artifacts that may be concentrated within the receiver, or largely concentrated within the receiver, and further may apply to situations involving concatenated coding and/or inner and outer coding schemes. Some examples of such situations may include (1) a carrier and phase tracking loop which experiences for a duration of time a phase tracking error excursion significantly larger than normal, (2) an inner code decoder which experiences a duration of poorer performance than typical (e.g., the ITU-T J.83 Annex B inner code decoder which may issue at its output a burst of errors due to incorrectly selecting a "path" which was not the transmitted path), (3) a coding scheme involving an inner coding and outer coding suited to application in a burst communications system for improved performance in burst noise as described within U.S. Utility application Ser. No. 10/175,330, entitled "System, method, and computer program product for mitigating burst noise in a communications system," now U.S. Pat. No. 7,631,242, referenced above), (4) a receiver employing a Decision Feedback Equalizer (DFE) can exhibit an error propagation characteristic, especially with high density constellations and/or large coefficients in the DFE taps, which could appear as "burst noise" to a subsequent decoder, (5) other aspects of receiver synchronization and operation, which may undergo a period of time wherein the accuracy or performance is notably worse than "normal," and this could even be simply experiencing the "tails" of the distribution of expected performance, and (6) a combination of the above, or of some or any of the above with an assortment of other sources of degradation. As stated, many other mechanisms can be associated with "burst noise" which is beneficially treated with the teaching of the techniques of this disclosure, etc.

The various aspects and principles presented herein may operate in accordance with those described in U.S. Utility application Ser. No. 10/000,415, entitled "Detection and mitigation of temporary impairments in a communications channel," now U.S. Pat. No. 7,308,050, referenced above, which not only complement existing decoding and partial decoding techniques, but also described the advent of additional partial decoding techniques for multiple interleaved codewords (e.g., as referenced herein as well).

Figure 3:
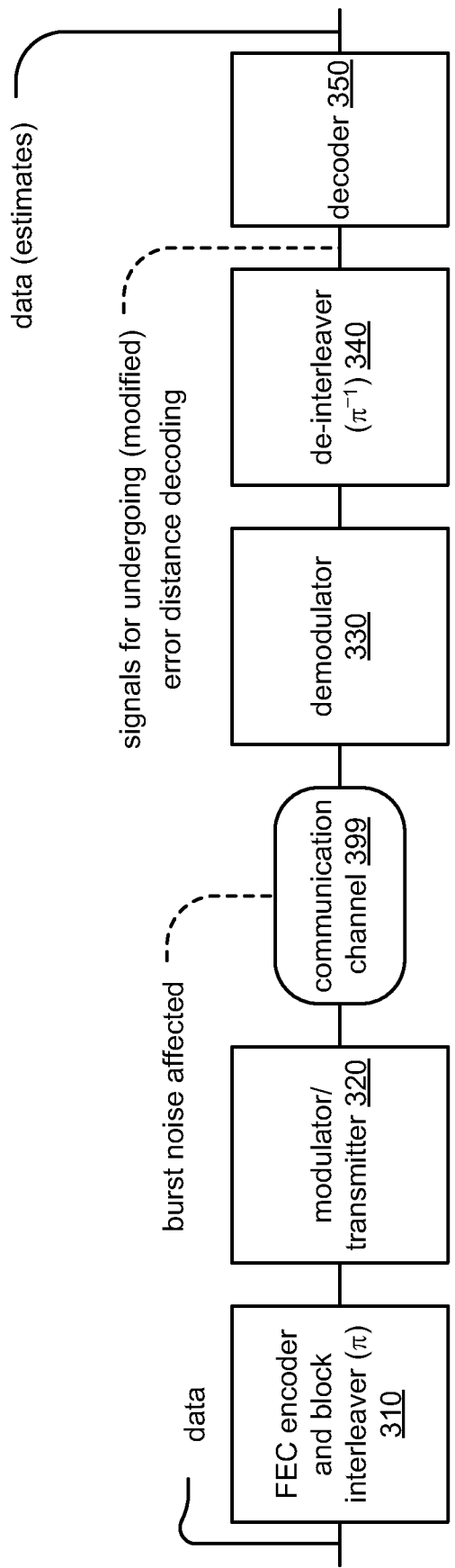
FIG. 3 illustrates an embodiment of a communication system, employing interleaving, with a burst noise affected communication channel.

FIG. 3 illustrates an embodiment of a communication system, employing interleaving, with a burst noise affected communication channel. This diagram related to the optimality of performing minimum distance decoding with Forward Error Control (FEC) coding. Such application may be directed for use of hard or soft decisions by a demodulator and respective decoder. For decoding of many FEC codes operating using a communication channel that may incur additive white Gaussian noise (AWGN) (e.g., with equally likely bits and/or codewords), the implementation of minimum distance decoding can provide an optimal solution in terms of minimizing the error rate. In other words, the codeword with bits or symbols which are "closest" to the received signal may be deemed the most likely codeword that was transmitted, and selection of this codeword maximizes the probability of choosing the correct codeword, in general. Of course, sometimes there are other choices besides selecting a codeword at the receiver as the estimated transmitted codeword, such as "failing to decode," wherein sometimes the receiver/decoder does not declare an estimate for the received codeword. Still, it is widely known and understood that minimum distance decoding is an optimal decoding approach in a wide range of applications and circumstances.

In some embodiment, soft decisions as provided from a demodulator are employed at the decoder, and in other embodiment, hard decisions are employed by a respective decoder. In using hard decisions, each transmitted symbol or bit is estimated at the demodulator (e.g., such as in accordance with a slicer), and this decision is passed on to the decoder. In using soft decisions, not only is the estimate of the transmitted symbol or bit passed along to the decoder, but also some information about the confidence or likelihood of the estimate is passed along (e.g., such as in accordance with a Viterbi detector embodiment). This information about the likelihood or confidence that the most likely symbol is indeed the correct choice is the "soft information". Rather than the demodulator making a "hard decision", the demodulator has not acted with such certainty, and has instead provided a "softer" decision (e.g., a decision and a corresponding confidence or likelihood thereof). If there are more than a pair of symbol choices for the demodulator at a given symbol instance, then soft decision information often would include confidence or likelihood measures for the most likely symbol, and also for other symbols.

With binary codes (e.g., based on a Galois Field, GF(2)), symbols and arithmetic (bits) (e.g., Hamming codes), each bit can be assigned a probability/likelihood or soft decision information by the demodulator, even if binary signaling is not employed by the modulator/demodulator.

In binary codes where hard decisions are employed by the demodulator and decoder, minimum distance decoding rule may be viewed as being analogous to selection of the codeword which has the fewest disagreements with the received bit sequence from the demodulator. The difference between the estimated codeword and the received sequence is "0" for the bit positions in agreement and "1" for the bit positions that disagree, and the selected codeword using the "minimum distance" decoding principle is the codeword which provides for the difference to have the minimum Hamming weight (e.g., that one having the fewest "1"s or disagreements).

When soft decisions are available and used by the decoder (e.g., in accordance with AWGN with equally likely symbols), the relative likelihood of each possible symbol choice is inversely proportional to the distance-squared of the received voltage from said symbol expected (noise-free) voltage. The minimum distance decoding rule with soft decisions corresponds to selecting as the estimated codeword that particular codeword which, if transmitted, would be "closest" to the actually demodulated/received signal. As the reader will understand, the "closest" may be measured by summing the distance-squared of each component symbol (differencing the received voltage with the noise-free voltage of the corresponding symbol from said codeword). The "closest" codeword matching the received signal is the codeword which has the smallest total distance-squared in comparing its noise-free transmission with what was actually received.

If the actual (relative) distance or distance-squared is available and used by the decoder, and certain other typical conditions apply, then this is categorized as "infinite precision soft decision" decoding. If the distance or distance-squared is quantized to a finite range of values, then this is termed "n-bit soft decision" decoding, where in general n=log 2 (number of quantization levels). This diagram (FIG. 3) illustrates the basic operations and flow in a communication system using FEC and interleaving in the presence of a burst noise affected communication channel 399.

As may be seen, data (e.g., information bits and/or symbols) are provided to a FEC encoder and block interleaver ($\pi$) 310. This FEC encoded and interleaved signal is provided to a modulator/transmitter 320 that is operative to perform any desired operations such as scaling, filtering, digital to analog conversion, symbol mapping, etc. As the signal output from the modulator/transmitter 320 traverses the communication channel 320, any of a number of deleterious effects may be incurred (e.g., burst noise, distortion, and/or any other impairment). A demodulator 330 then processes the signal received from the communication channel 399, by performing any of a number of desired operations such as digital sampling (e.g., using an analog to digital converter (ADC)), scaling, filtering, symbol de-mapping, etc. thereby generating a digital signal that is provided to a de-interleaver ($\pi^{-1}$) 340, the output there from being provided to a decoder 350 that is operative to make estimates of the data provided to the FEC encoder and block interleaver ($\pi$) 310 on the left hand side of the diagram. Ideally, the estimates of the data and the data are the very same. However, in real world/imperfect applications, such deleterious effects (e.g., burst noise, distortion, and/or any other impairment) may make proper demodulation and decoding of a signal received from the communication channel 399 more difficult. Using various aspects and principles, and their equivalents, as presented herein, such deleterious effects may be mitigated (if not eliminated) thereby enabling or making easier the proper demodulation and decoding of a signal received from the communication channel 399.

Figure 4:
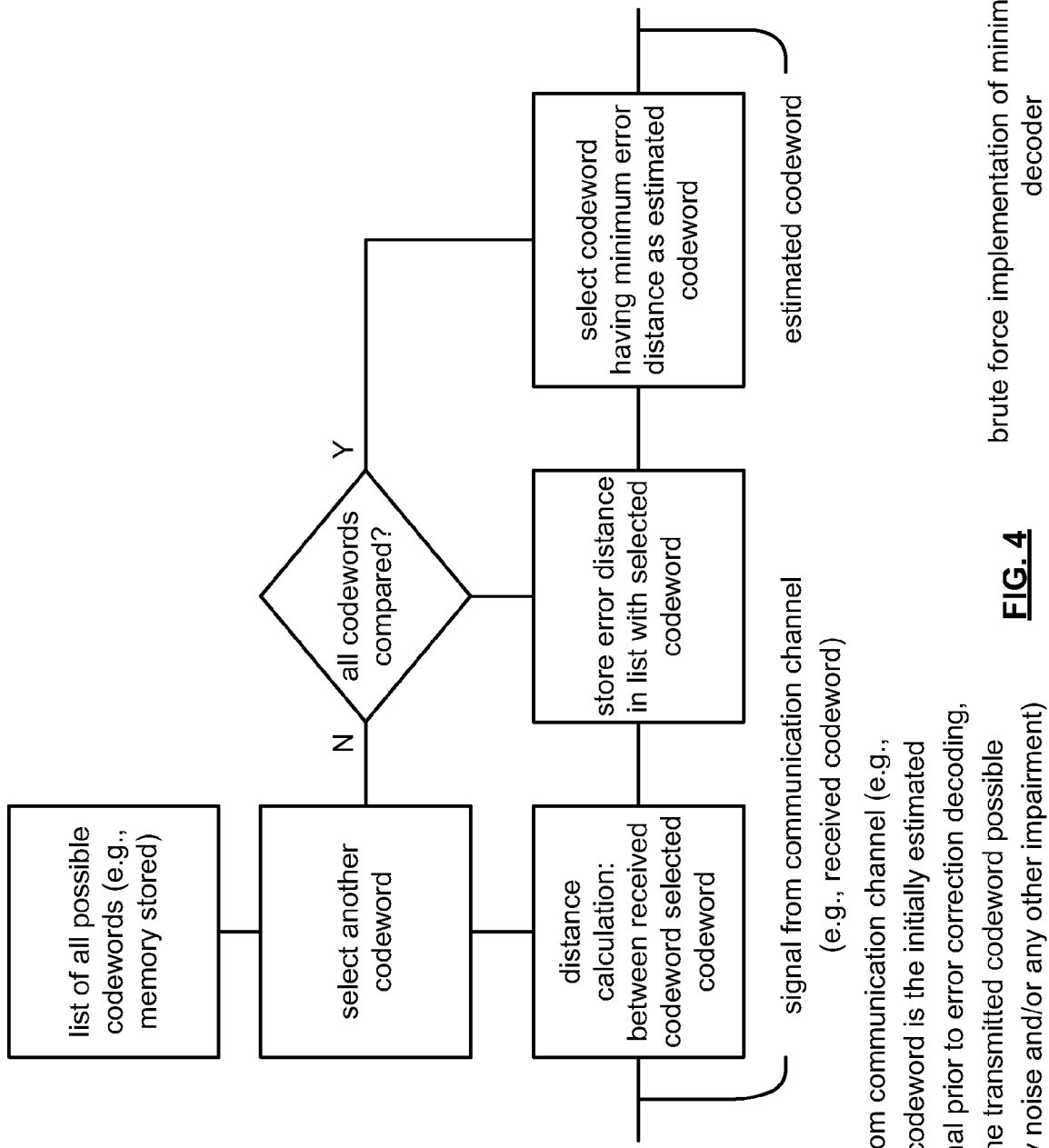
FIG. 4 illustrates an embodiment of a brute force implementation of a minimum distance decoder.

FIG. 4 illustrates an embodiment of a brute force implementation of a minimum distance decoder. It is of course noted that many techniques have been developed over many decades to implement various decoding principles, for various codes and families of codes. Many approximations and simplifications have been developed and employed to achieve simpler implementations than the brute force optimal decoders would necessitate, sometimes even at the expense of providing suboptimal performance.

For binary codes with hard decisions or soft decisions, applying the minimum distance decoding principle can be accomplished in a brute force manner by determining the distance (e.g., either the Hamming weight for hard decisions or the distance-squared described above with soft decisions) of the received signal with the noise-free signal that would be received for each of the possible codewords. This diagram illustrates the brute force implementation of minimum distance decoding in the FEC decoder.

For a respective signal (e.g., received codeword) received from a communication channel, based on a list of all possible codewords (such as stored in memory), the corresponding distance is calculated and the error distance is stored in a list with the selected possible codeword currently being used for the distance calculation. This process continues through all possible codewords, and the possible codeword having the smallest minimum distance error is then selected as the estimated codeword. The same processing principles apply for non-binary coding (e.g., encoding and decoding) as well, but sometimes the respective error distance for received symbols needs to be processed into probability metrics and cannot be used directly without such processing (e.g., for optimizing probability of determining the correct codeword). This processing may be performed for additive white Gaussian noise (AWGN) communication channels.

In this general case and variant embodiment, the "store error distance" operations in FIG. 4 may then be more appropriately termed "store probability metric", and the final step of selecting the codeword involves selecting the codeword associated with the minimum probability metric, thus maximizing the probability of choosing the correct codeword given the received signal (e.g., in AWGN). In some cases of non-binary coding the "select codeword" operations in FIG. 4 may correspond to selecting candidate error positions rather than actually selecting a particular codeword. In such a case the error probability metric for a given vector of error positions (for the non-binary symbols in the codeword) may be computed as corresponding to the entire set of probabilities of codewords which result in the given position error vector, or may be derived from the codeword dominating the error probability, or by some approximation similar. The selection in the final operational steps of FIG. 4 relate then to the selection of an error position vector or set of likely error positions, and not an actual codeword selection. The error positions selected from the final operational steps of FIG. 4 can be used as a partial decoding result and fed to a decoder which can determine the error values in (or lack of error in some of) the candidate error positions; often this is achievable as long as the number of error positions is within a given limit. For example, with Reed-Solomon (RS) codes, error location values can be calculated knowing the error positions, and knowing the correct values outside the error positions, as long as the number of error positions is equal to or less than the number of parity symbols in the RS codeword.

In FIG. 4, the received signal from the communication channel (e.g., at the left hand side of the diagram) may alternatively correspond to (in a variant embodiment) an initially estimated received signal, prior to performing any error correction decoding, which may be then be characterized as the transmitted codeword that may be undesirably influenced by noise and/or any other impairment.

If a concatenated coding scheme is employed, one example being ITU-T J.83B, this signal may be the result of one or more decoding attempts or partial decoding attempts with an inner code, and the processing of such an embodiment may be understood as performing one iteration of decoding the outer code for a single codeword. The reader will of course understand that such applicability (e.g., of such a diagram illustrating the performing of one iteration of decoding) may be extended and applied to each of the other variant embodiments as described herein (e.g., FIG. 4, FIG. 5, FIG. 7, FIG. 8, and FIG. 9, etc.).

The processing and decoding operations shown in FIG. 4 may also correspond to the error correction decoding of the coded bits in a set-partitioned modulation communications scheme, wherein the calculations and results of this decoding are used in combination with the received information corresponding to the "uncoded bits" (which may actually be further coded in an outer coding scheme).

Figure 5:
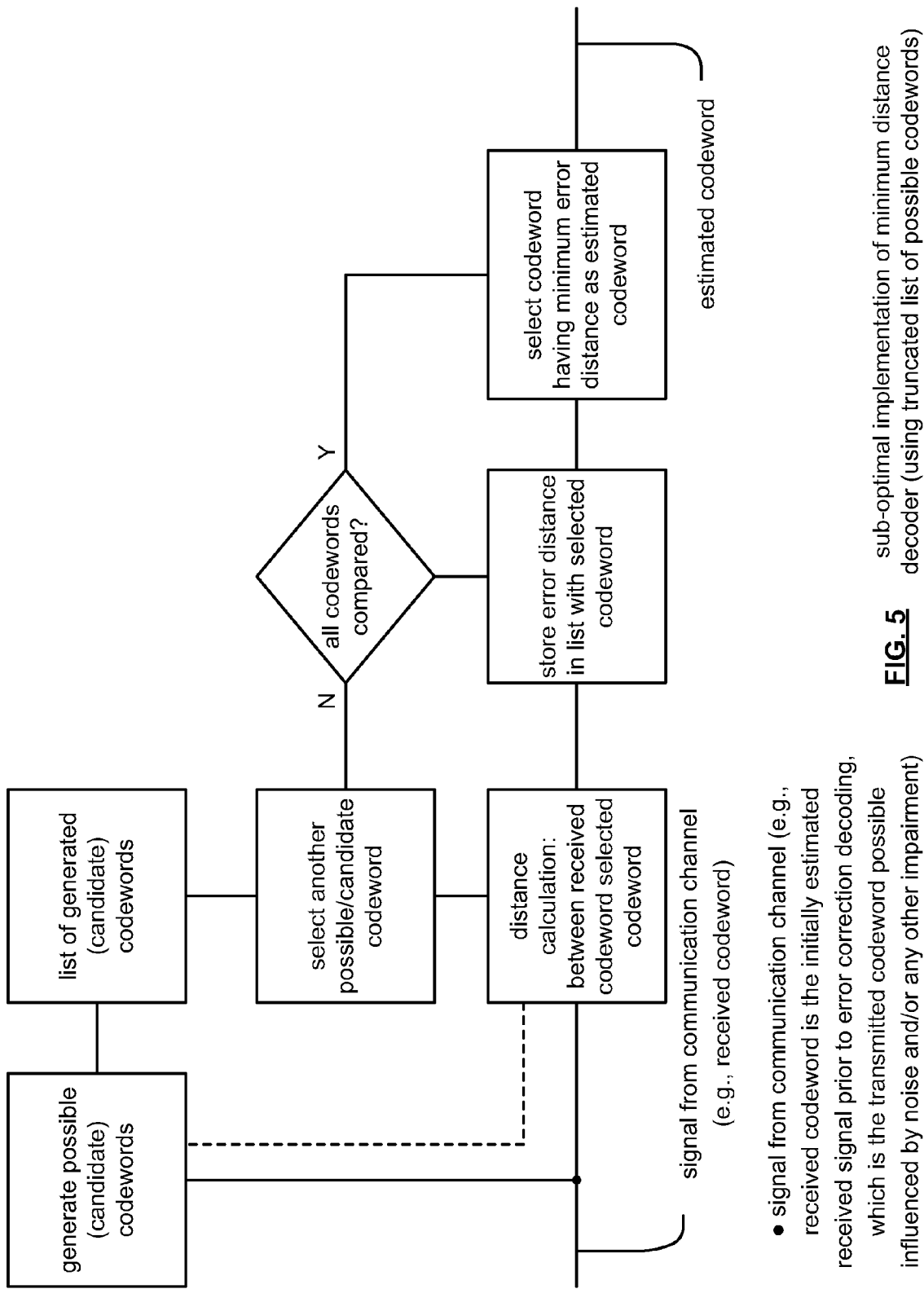
FIG. 5 illustrates an embodiment of a sub-optimal implementation of a minimum distance decoder (using a truncated list of possible codewords).

FIG. 5 illustrates an embodiment of a sub-optimal implementation of a minimum distance decoder (using a truncated list of possible codewords). Considering a concrete example in a finite precision system, if there are 11 information bits in a codeword, then there are $2^{11}$=2048 codewords available in the signaling set. For each respective transmission and codeword reception, the brute force minimum distance decoder would compute the distance (or distance-square or Hamming distance) of the actual received signal with what the received would have received noise-free for each of those 2048 codewords. Thus, there are 2048 distances computed for each and every respective, received signal (e.g., each and every respective, received codeword). The decoder, using the minimum distance decoding rule, then operates to select as the estimated codeword that codeword which corresponds to the lowest such minimum distance error. This is the codeword which is "closest" to the received signal. Of course, in a real life application, this is the codeword whose transmitted waveform, received noise-free, is closest to the received waveform).

In this alternative embodiment, rather than actually computing all 2048 distances for determining the estimation of a codeword, various techniques may be employed which require less computation. Often, these techniques result in a reduction in performance (e.g., resulting in a higher error rate). This is because such various techniques may identify a codeword as the estimate; however, that particular codeword may not actually be the closest codeword to the received signal. Often this reduction in performance is accepted in return for the simplification of the decoding process.

One embodiment of such a suboptimal decoder operates much as the optimal brute force decoder described above, but instead uses a subset of the codewords in the error distance calculations rather than all of the possible codewords. Such processing methodology is sometimes referred to as using a "truncated list of candidate codewords," and key issues in these methods are how many such candidate codewords to generate, and how to generate them. Ideally, the generated list of candidate codewords will include the codeword which is actually closest to the received signal.

In accordance with the practice of hard decision FEC decoding that uses certain reduced complexity techniques (e.g., such as using a "truncated list of candidate codewords"), decoding to the "closest" codeword may be achieved as long as the received signal (e.g., received codeword) is within a certain distance of the noise-free transmitted codeword, which may be called the guaranteed decoding distance.

Typically, this guaranteed decoding distance provided by the suboptimal decoder corresponds to roughly slightly less than half the "minimum distance" (e.g., labeled as $d_{min}$) of the code. The minimum distance of a code is the smallest distance separating two codewords in the codeword set. Many decoding approaches exist which provide a guaranteed decoding distance (e.g., a number of errors which will be guaranteed corrected in a received codeword) which is equal to half of $d_{min}-1$, rounded down to nearest integer if $d_{min}$ is even. This distance may be labeled "t" and is used to describe the error correction capability of a code assuming a good decoding approach is applied.

In some few codes (known as "perfect codes"), decoding with up to "t" errors in a received codeword is actually optimal, but with most codes (e.g., non-perfect codes), such a decoder is slightly suboptimal. With such non-perfect codes, the receiver could provide a sequence to the decoder with more than "t" errors, which is still "closer" to the correct (transmitted) codeword than to any other codeword, but for which the decoder will fail (since it is only capable of correcting up to "t" errors by assumption in this example). In this case, the decoder is not guaranteed to provide the correct codeword as its estimate even though the correct codeword is the "closest" codeword to the received signal.

Another example of a class of decoders which is generally suboptimal corresponds to those decoders that operate based on "error trapping." Such decoders are operable to correct up to and including some number of errors as long as all the errors are constrained to be within a subset range of consecutive positions within the codeword. Generally speaking, such decoders are operable on cyclic codes such that a shifting procedure will then allow the subset range to readily move around the set of entire codeword positions, but with the constraint that all errors fall within a finite span remains, even as the examined window span is moved or rotated. Variations and additions to such error trapping decoders allow for correction of some number of errors outside the examined span, but still, these techniques are in general suboptimal variations of minimum error distance decoding, in that, error patterns occur which sometimes would be correctable in the optimal decoder but for which too many errors fall outside the trapped span, even for all rotations of the trapped span across the codeword.

The various aspects and principles, and their equivalents, of the invention as described herein of course apply to block coding FEC. It is also noted that such principles and techniques also apply to convolutionally coded FEC. With convolutionally coded FEC, though specific decoding techniques may be different, the principle of minimum error distance therein still applies and may benefit from various aspects and principles, and their equivalents, of the invention.

Optimal minimum distance decoding is available via the Viterbi processing approach (e.g., an application of linear dynamic programming to solving for the "path" characterized by minimum error power), as long as infinite decoding lag is allowed, and near-optimal minimum error distance decoding occurs with reasonably truncated lag times. Viterbi decoding techniques become complex when the number of "states" of a convolutional encoder becomes large, and other suboptimal techniques are available for such applications that, in general, correspond in a fashion to the truncated list of candidate codewords decoding (e.g., in block code FEC). If a convolutional FEC technique is employed in a communication system, but the transmission is terminated in a finite amount of time, or a lag in decoding is permissible effectively to allow "ignoring" of the received signal at some point into the future of the time corresponding to the currently estimated signal epoch, then the convolutional FEC may be treated in some respects as a block FEC.

In "burst noise" affected communication channels, the statistics of received symbols or bits are not stationary, as may assumed in an additive white Gaussian noise (AWGN) communication channel. In one extreme case, a communication channel undesirably affected by "burst noise", such a communication channel may be characterized as being an AWGN channel for some duration of symbols, possibly recurring occasionally, but containing no noise for all other symbols. The duration of the degraded channel, often in terms of the number of impacted symbols, may be characterized as being rigidly periodic in nature with fixed duty cycle and repetition rate, or may be of fixed duration but occurring with a probabilistic rate (e.g., as in accordance with Poisson distributed "arrival" times), or may be characterized by both random duration and arrival time; other variations are conceivable. Several possible models may be employed for characterizing "burst noise" affected communication channels. Sometimes, the implementation of a particular receiver leads to time-varying demodulator performance, and this type of impairment can be one embodiment of a "burst noise" channel.

The characterization of the communication channel, when impaired by some deleterious effects (e.g., burst noise, distortion, etc.) and when "normal" (e.g., not impaired), is often more complex than assigning an AWGN value during the impairment and no noise otherwise. Assigning two different AWGN levels for the two different channel states is one approach, and other approaches may go beyond even the AWGN modeling. For example, such variations may be performed where even at one instant in time the AWGN power, or other characteristics of the noise or distortion, may vary depending upon which constellation symbol is transmitted; this includes such variations as described in U.S. Utility application Ser. No. 10/112,009, entitled "Modified branch metrics for processing soft decisions to account for phase noise impact on cluster variance," now U.S. Pat. No. 7,136,435 B2, referenced above.

In some cases, rather than addressing the demodulator and channel noise directly, the communication channel may be described by the probabilities that a hard decision demodulator would be able to provide in making its decisions during the two (or more) different channel states. It is noted that more complex models may have more than two different channel states, in general, but the various aspects and principles, and their equivalents, of the invention apply to those embodiments as well. For example, perhaps a binary signaling channel would be characterized by the demodulator having a probability of bit error of 0.5 during a burst event, and 0 during "normal" operation. Another example could be that the communication channel provides a bit error rate of 0.2 during the burst noise, and $10^{-6}$ during "normal" operation. These are but two examples of an infinite number which are possible for this type of characterization.

In accordance with the various aspects and principles, and their equivalents, of the invention, the reader may understand that these aspects and principles, and their equivalents, may be applied to burst noise channels in general, though the choice and quantitative characterization of the burst noise may alter the choice of most appropriate parameters or variations employed.

In some embodiments of the reduced processing illustrated in FIG. 5, additional candidate codewords may be generated as a result of the comparison of one or some of the candidate codewords with the received codeword, or as a result of other of the processing described in association with or related to FIG. 4 and/or FIG. 5, and this feedback generation of additional candidate codewords may continue for multiple iterations. The generation of additional candidate codewords as a result of the processing of the operations depicted and described in association with FIG. 4 and/or FIG. 5 is illustrated by the dashed line in FIG. 5.

Figure 6:
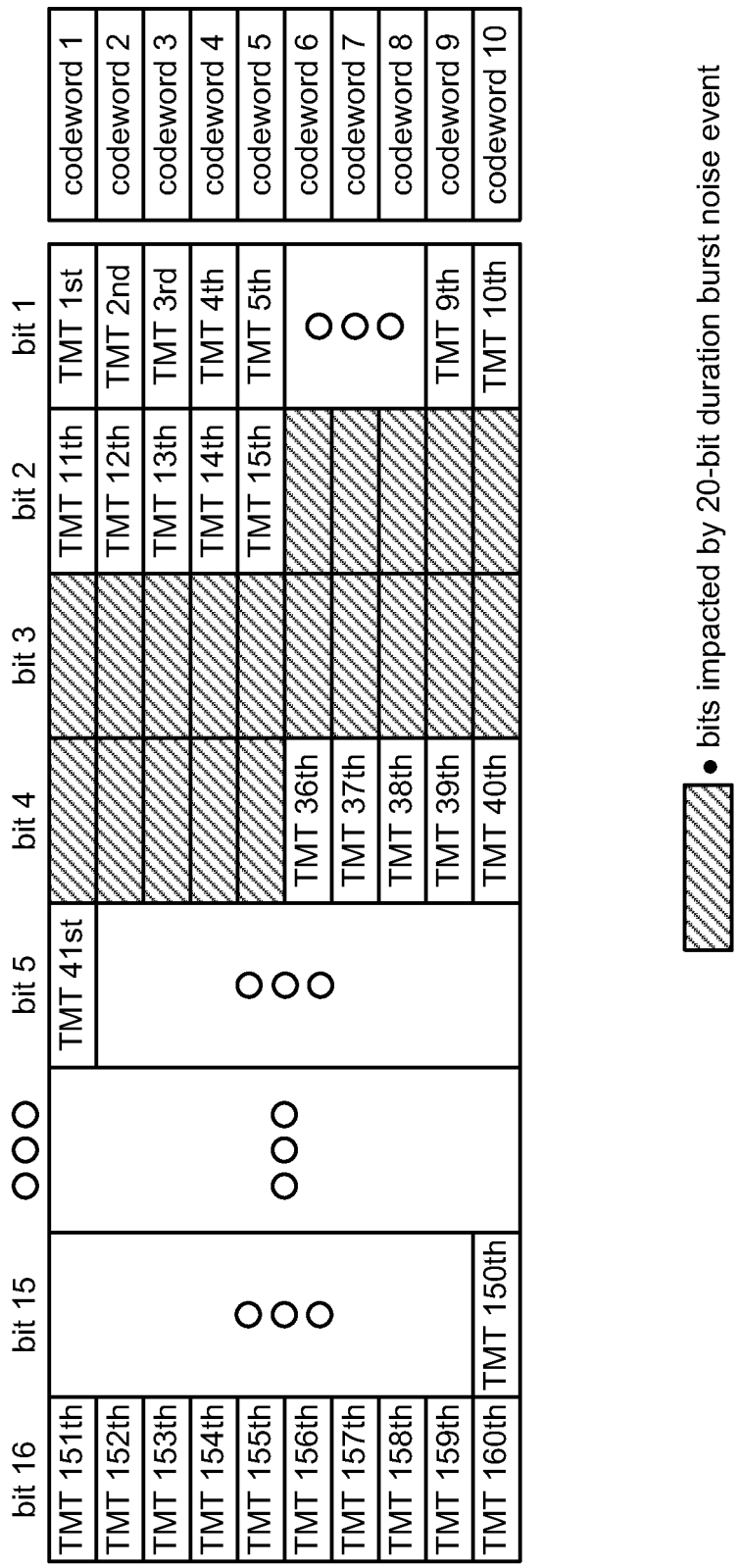
FIG. 6 illustrates an embodiment of multiple codewords and the respective bits therein that are affected by burst noise.

FIG. 6 illustrates an embodiment of multiple codewords and the respective bits therein that are affected by burst noise. This diagram depicts a number of codewords employed in accordance with a communication system using forward error correction (FEC) coding and block interleaving.

This diagram shows an illustration of the behavior of block interleaved codewords as provided into a decoder, operating with a "noise burst" during the reception of the interleaved codewords. The diagram illustrates block interleaving, which provides "rows", such that each row containing one complete codeword, to the decoder. The top row is the first codeword read into the decoder, and the second row is the second, etc., but this ordering is not critical and any desired permutation of the codewords (if accounted for) may be employed without departing from the scope and spirit of the invention. In this embodiment, the first bit transmitted through the communication channel is the bit in the top right corner, the second bit is in the far right column and second row, and so on down the far right column, and then on to the top row again in the second column from the far right.

In this particular embodiment, the codeword length is 16 bits, with a binary signaling channel assumed, and the block interleaving allows 10 codewords to be interleaved, so there are 10 "rows". In this embodiment, the communication channel exhibits a deleterious "burst noise" effect for a duration of 20 bits (or symbols), beginning with the $16^{th}$ transmitted bit of the interleaved block. The bits impacted by the burst noise are indicated in the diagram with hashed lines. It may be seen that while 20 consecutive bits are impacted by the burst noise, only two such bits are impacted in each codeword. In the top five codewords bits 3 and 4 are impacted by the burst noise, while in the bottom five codewords bits 2 and 3 are impacted. As may be seen, each codeword has only two bits (symbols) impacted by the burst event, due to the benefit of the interleaving.

The situation depicted in this diagram has been explained as arising from a burst noise event in combination with an interleaved set of codewords, whereupon the de-interleaving operation at the receiver works to focus the bits (or symbols) impacted by the burst noise event into the same bit (or symbol) positions within each codeword. The same focusing of degraded bits or symbols into like positions among a set of codewords can occur in other situations besides burst noise and interleaving, and various aspects and principles, and their equivalents, of the invention apply equally well to these additional situations and embodiments. An alternative situation can include the use of orthogonal frequency division multiplexing (OFDM) in which a tone (or a subset of tones) in OFDM can be dedicated to one codeword, and another tone (or subset of tones) can be dedicated to another codeword, and so forth. Thus, if one OFDM symbol interval is degraded by an impairment, then if the codewords are aligned properly, the same symbol or bits of each codeword would be similarly impacted, similar to what is shown in this diagram and also with reference to FIG. 11.

Yet another situation can include the use of synchronous code division multiple access (S-CDMA) in which different respective subsets of symbols, each having a respective and different spreading code, may be provided synchronously or in parallel with respect to each other. Similarly assigning codewords to one or several S-CDMA spreading codes, while other codewords are assigned to other spreading codes and aligned and synchronized with each other, then an impairment degrading one spreading interval will impact the same bit positions of each codeword, again similar to what is shown in this diagram and also with reference to FIG. 14.

Additionally, other assignments and alignments are possible with other impairments which result in degradation of like-positioned bits or symbols in an ensemble of codewords. For example, codewords sent using multiple channels, with each codeword using one or several channels, and multiple codewords aligned and synchronized across the channels, will respond to impairments impacting many or all of the channel simultaneously much as depicted in this diagram. Another example is using a particular tone or channel or spreading code to send a particular bit or symbol from each codeword in an ensemble, sending the i-th bit of codeword #1 on the i-th tone, followed by sending the i-th bit of codeword #2, and so forth, one after the other; when one channel (or tone, or spreading code) is degraded by narrowband interference (for example), the result is a pattern of degraded bits or symbols across the ensemble of codewords again similar to what is shown in this diagram.

Generally speaking, any communication system in which multiple 'channels' (e.g., whether those 'channels' be in accordance with any desired type of signaling such as OFDMA, S-CDMA, etc.) are communicated in parallel may employ various aspects and principles, and their equivalents, of the invention.

Figure 7:
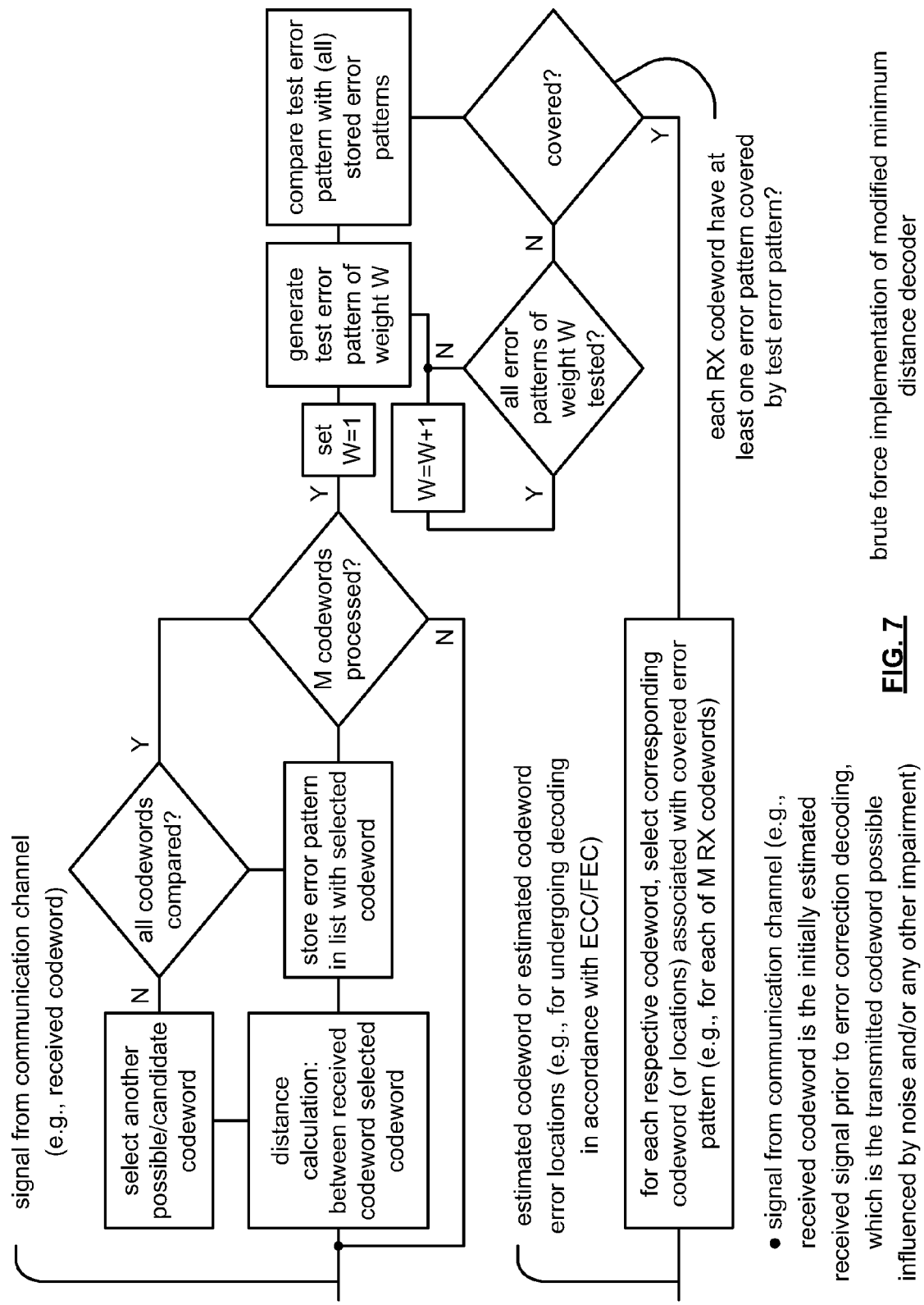
FIG. 7 illustrates an embodiment of a brute force implementation of a modified minimum distance decoder (e.g., alternative embodiment of a minimum distance decoder).

FIG. 7 illustrates an embodiment of a brute force implementation of a modified minimum distance decoder (e.g., alternative embodiment of a minimum distance decoder). Certain aspects and principles, and their equivalents, of the invention may be understood in accordance with this diagram of the general brute force implementation of a modified minimum distance decoder. In some aspects, this approach corresponds to an exhaustive version of optimal modified error distance decoding that is operative to perform an exhaustive brute force approach. A set of M deinterleaved codewords are input to the approach and processed as shown in the diagram. If the codeword positions represent symbols, rather than bits, then the identified error positions can be used in an erasure decoding approach in one embodiment.

In accordance with various aspects and principles, and their equivalents, of the invention, the brute force implementation of the modified error distance decoding approach calls for calculating the error positions when comparing each respective received signal (e.g., each respective received codeword) in the signaling set with the first received signal (or codeword). For this first received codeword, the error positions are calculated and stored for each of the $2^k$ possible signaling codewords. The test error pattern calculated by comparing the i-th signaling signal (codeword) (if they are enumerated by i=1, 2, . . . , $2^k$) and the j-th received signal (codeword) (for j=1, 2, . . . M), can be denoted as a "calculated error pattern (i, j)". There are $m^k$ possible signaling codewords for non-binary codes that have m symbols in their respective alphabet.

The second received signal (codeword) is then fully processed in the same fashion, and so on, until the full group of M codewords is so processed for error positions in relation to each signal (codeword) in the signaling set. With $2^k$ codewords in the signaling set, there are $M \times 2^k$ error position vectors now stored.

The next step of this modified minimum distance decoding approach includes determining the minimum weight error pattern which "covers" the M received signals (codewords) (or any desired subset thereof). A test error pattern of weight W will have W error positions. If the error positions of error pattern (i, j) are a subset (including a perfect match) of the test error pattern, then the test error pattern is said to "cover" the error pattern (i, j). Whenever a test error pattern is found which "covers" at least one of the $2^k$ error patterns (i, j) for received signal (codeword) #j, then that particular test error pattern may be described as "covering" that received signal (codeword) #j.

Considering an example, stated another way, if a received signal (codeword) has one bit (or symbol) received in error, then one and only one test error pattern of weight W=1 will "cover" the received signal (codeword). This will then be the test error pattern with exactly one error position in precisely the error position where the received codeword experienced its reception error. Of course, this is based upon the assumption that the particular FEC or ECC code is capable of detecting at least one single error within a received signal (codeword).

If there is an ECC capable of correcting two errors, then its respective minimum distance ($d_{min}$) is at least five; if two received bits (or symbols) are in error in the received codeword, then one and only one test pattern of weight W=2 will "cover" the received codeword. This follows since the only signal (codeword) in the signaling set that can be at Hamming distance 2 from the received codeword is in fact the transmitted signal (codeword) itself. All the other signals (codewords) are at a Hamming distance of 3 or more from the received signal (codeword).

As such, the reader will understand that no test error pattern of weight W=1 will cover this received signal (codeword), and many test error patterns of weight W=3 and higher will cover the received signal (codeword). In fact, if there is a signal (codeword) of Hamming distance 5 from the transmitted signal (codeword), e.g., signal (codeword) #2 being a distance 5 from transmitted signal (codeword) #1, then it is possible that with the two bits (or symbols) received in error, that a weight W=3 test error pattern will "cover" the received signal (codeword) but correspond to signal (codeword) #2 rather than to the transmitted signal (codeword). This test error pattern will have three error positions and none of them will be the two error positions which were actually received in error. Still, this W=3 test error pattern "covers" the received signal (codeword). As may be understood, this W=3 test error pattern unfortunately does so in a manner that corresponds to an incorrect signal (codeword) (e.g., rather than to the actually transmitted signal (codeword)).

This modified error distance decoding approach, as illustrated in the diagram of FIG. 7, also described finding a test error pattern of minimum weight which "covers" each of the M received signals (codewords) (e.g., codewords plus noise and/or some other impairment).

In a brute force approach, through every possible codeword, compare the possible codeword with the received signal, if the received signal differs from the possible signal (codeword) in only the test error positions (or a subset thereof), then that test error pattern covers the received signal (codeword). In certain embodiments, it is noted that the truncated list of candidate codewords approach can be applied to reduce the complexity if a resulting sub-optimal error rate performance is acceptable. When a test error pattern is found which "covers" a received signal (codeword), the signal (codeword) in the signaling list which corresponds to the error pattern so "covered" is identified as the estimated signal (codeword) corresponding to that test error pattern (e.g., as indicated in the figure). When a test error pattern is found (by the systematic search shown in the figure) which by itself "covers" each of the M received signals (e.g., codewords plus noise and/or other impairment), then for each of the M received signals (e.g., codewords plus noise and/or other impairment) the corresponding estimated codeword is produced (again, shown in the diagram).

In the case of non-binary coding a multiple codewords may correspond to even the minimum weight test error pattern. The operation and treatment in accordance with such multiple codewords is described below. As a foreshadowing, additional information is applied, in general, to resolve the multiple codewords which are consistent with the vector of error positions identified by application of the modified distance decoding metric, into a single codeword choice for each received codeword which generates a multiplicity. In such a case, the modified distance decoding metric is seen to be generating a vector of error positions, in a partial decoding, wherein additional processing consistent with the modified distance decoding metric provides a complete decoding.

In accordance with the systematic nature of the approach, the minimum weight "covering" error pattern is then produced for the set of M received signals (e.g., signals (codewords) plus noise and/or other impairment). The reader may then understand the appropriate nomenclature of this particular decoding approach as being the modified error distance decoding approach. The estimated signals (codewords) form a minimum error distance (from their respective received signals (codewords)) over the set of M received signals (codewords) (e.g., codewords plus noise and/or other impairment). The modified measure of error distance corresponds to the minimum weight of any "covering" error pattern for the set of M received signals (e.g., codewords plus noise and/or other impairment).

As can be seen with respect to this embodiment, the weight being applied to the respective test error patterns may be modified accordingly (e.g., as the weight W is incremented). In other words, test error patterns of many different, respective weights are employed for comparison with the stored error patterns. The covering consideration or testing, in the decision block at the lower right hand corner of the diagram, is whether each respective, received signal (codeword) does in fact have at least one error pattern covered by the test error pattern. If so, then for each respective, received signal (codeword), the modified error distance decoding approach operates by selecting the corresponding signal (codeword) associated with the covered error pattern. It is noted that this processing operates for each of the respective, received signals (codewords).

When there is a multiple codewords associated with a covering error pattern, the operations may proceed as follows. In addition to the processing described with reference to FIG. 7, an alternative embodiment calls for an attempted decoding of each of the individual codewords in a (non-modified error distance) error correction decoder prior to the insertion of the received codeword into the processing illustrated in FIG. 7. When this decoding is successful, the corrected codeword is input to the "distance calculation" operation as "received codeword". When this successfully decoded codeword is compared with itself from the list of candidate codewords, or a full list of codewords, then of course it has zero errors. The error positions located by the successful decodings of such individual codewords can be used to guide the selection and creation of candidate codewords for comparison with the adjacent and near-adjacent other received codewords which did not successfully decode in conventional individual decoding attempts. In another embodiment, individual decoding is attempted on each received codeword, and used to guide selection of candidate codewords, but is not used in the distance calculation. In another embodiment, both the successfully individually decoded codeword results and the received signal can be included in comparisons and either or both may contribute to achieving a successful group decoding. If all codewords in a group are successfully decoded in individual decodings, then group processing may be eliminated in yet an alternative embodiment. If only a few received signals cannot be successfully decoded by individual decoding, and these share a number of positions commonly impacted by burst noise or other impairment, then a group decoding is attempted in one embodiment using neighboring codewords (e.g., sharing positions potentially impacted by burst noise) and their decoding and soft decision results guide the selection of candidate codewords.

In accordance with the operations of FIG. 7, it may be seen that decoding with the new modified error distance decoding metric may provide a number of benefits and improved performance. Of course, equivalents and variations of the operations related to the generation of decoded codewords and/or error locations, in accordance with various aspects and principles, and their equivalents, of the invention and as described with reference to FIG. 7 may be performed without departing from the scope and spirit of the invention. Variations taught in association with the remaining figures and written description, in accordance with the principles of modified error distance decoding taught here-in, for a group of codewords, are of course envisioned within the scope and spirit of the invention. As the reader will understand, the various operations presented herein in accordance with modified error distance decoding are novel, and the application of such a new metric may be applied for use in decoding in communication system and application in which the impairment is not necessarily stationary AWGN in nature.

Figure 8:
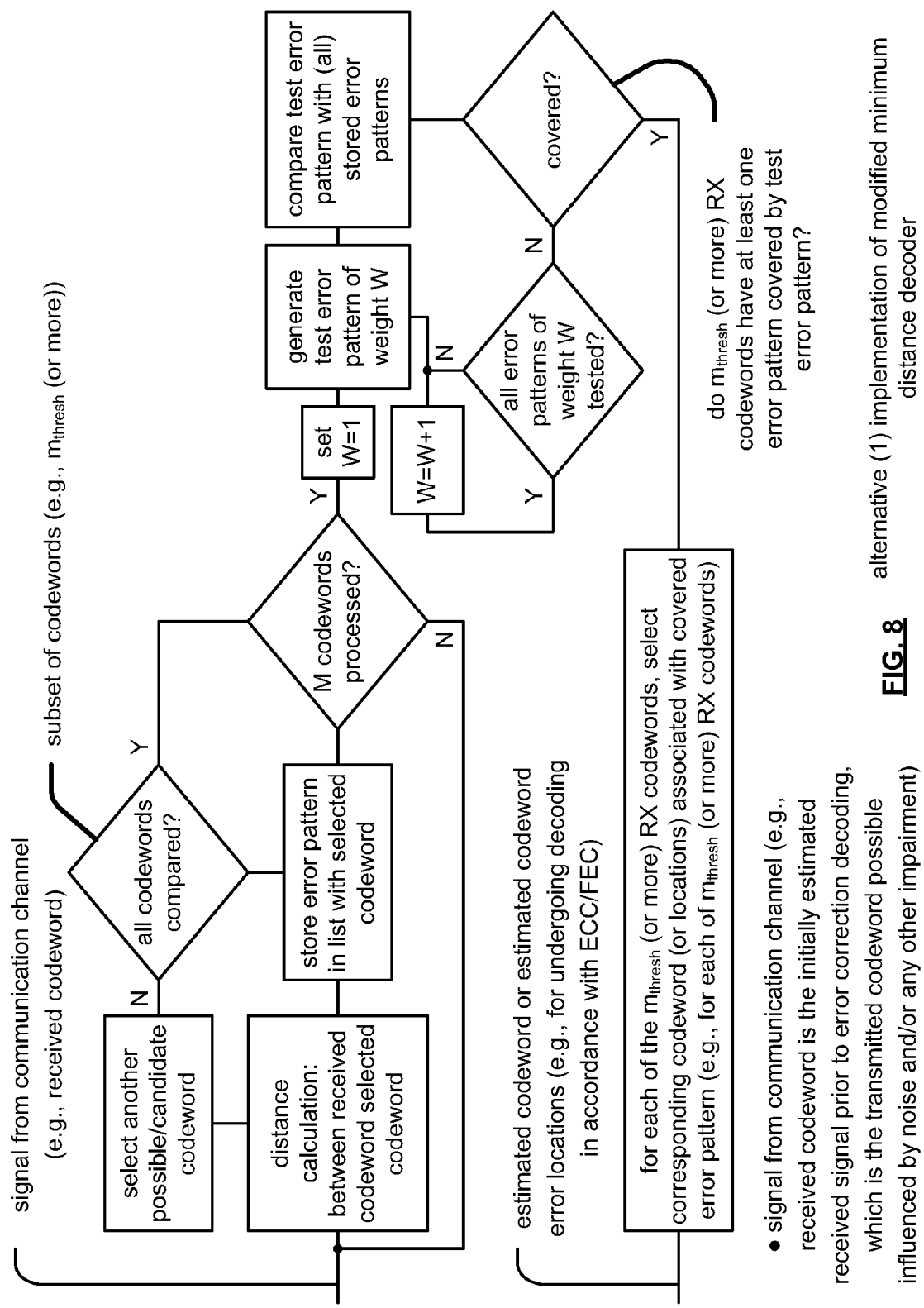
FIG. 8 illustrates an embodiment of an alternative (1) implementation of a modified minimum distance decoder.

FIG. 8 illustrates an embodiment of an alternative (1) implementation of a modified minimum distance decoder. As may be seen, there are certain similarities with this variant to certain of the previous embodiments, with at least one difference being that this embodiment operates by looking for matching $m_{thresh}$ received signals (codewords) (e.g., codewords plus noise and/or some other impairment), or more than $m_{thresh}$, out of the M received signals (codewords). The covering consideration or testing, in the decision block at the lower right hand corner of the diagram, is whether $m_{thresh}$ or more of the received signals (codewords) have at least one error pattern "covered" by the test error pattern. The selection of the appropriate signals (codewords) is performed in accordance with selecting the codeword associated with the "covered" error pattern for each of the $m_{thresh}$ (or more) received signals as being the as the estimated codeword.

Figure 9:
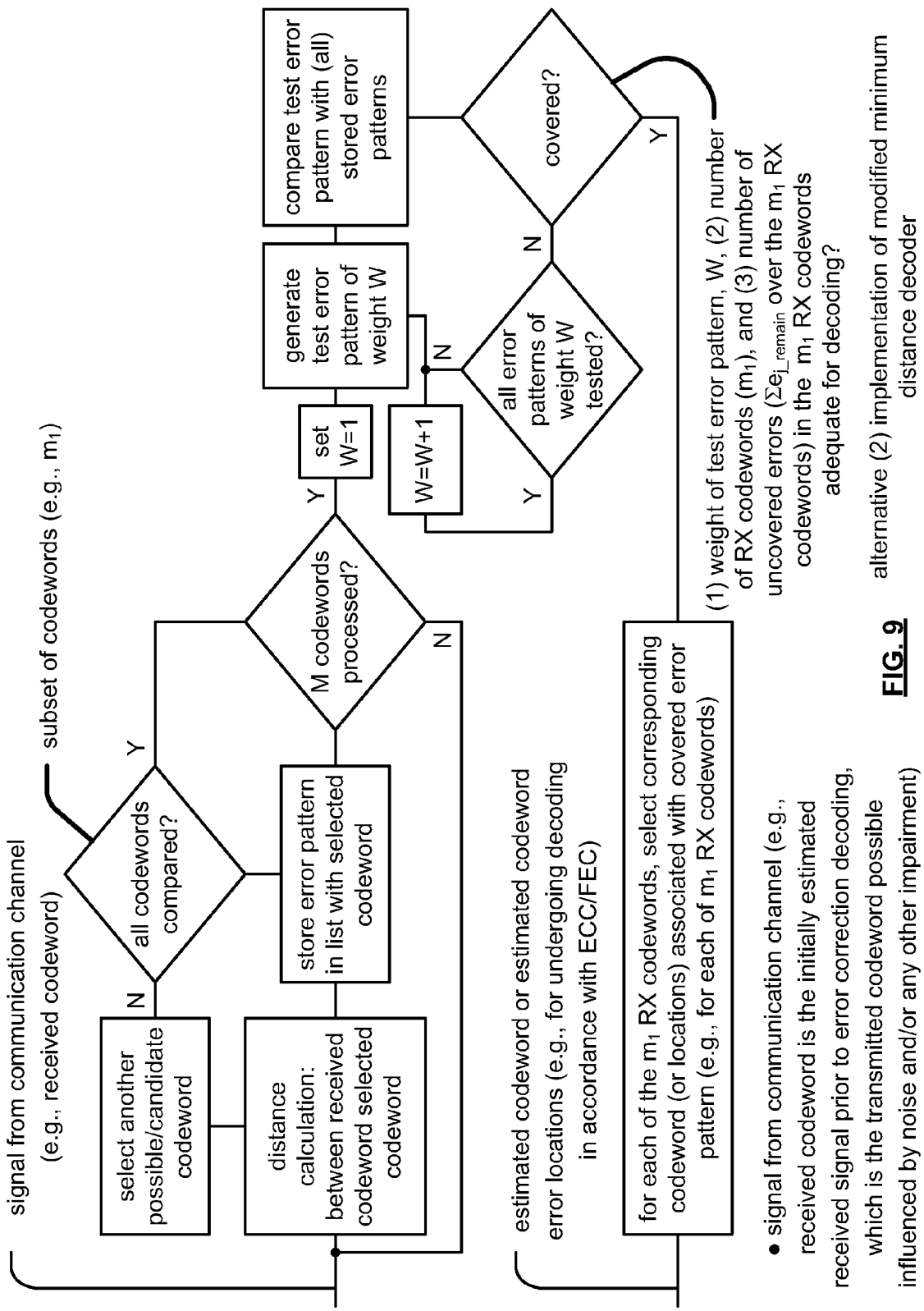
FIG. 9 illustrates an embodiment of an alternative (2) implementation of a modified minimum distance decoder.

FIG. 9 illustrates an embodiment of an alternative (2) implementation of a modified minimum distance decoder. As may be seen, there are certain similarities with this variant to certain of the previous embodiments, with at least one difference being that this embodiment operates by considering a number of different factors. For example, this embodiment operates by looking for matching a suitable combination of (1) weight W of test error pattern, (2) $m_1$ received signals (codewords) (e.g., codewords plus noise and/or some other impairment), out of the M received signals, and (3) number of errors, $e_{j\_remain}$, in the $m_1$ received signals which are not covered by the test error pattern.

The covering consideration or testing, in the decision block at the lower right hand corner of the diagram, is whether (1) the weight of the test error pattern W, (2) the number of received signals $m_1$, and (3) the number of uncovered errors (sum [Σ] of $e_{j\_remain}$ over the $m_1$ received signals) in the $m_1$ received signals, are all adequate for decoding. The selection of the appropriate signals (codewords) is performed in accordance with selecting the codeword associated with the "covered" error pattern for each of the $m_1$ received signals as the estimated codeword. In other embodiments, as an alternative to the summing of $e_{j\_remain}$ over the $m_1$ received signals, and deciding if this provides an acceptable triplet when combined with W and $m_1$, the maximum of $e_{j\_remain}$ over the $m_1$ received signals can be used in combination with W and $m_1$.

In various other embodiments, if more than one signaling codeword corresponds to a test error pattern which covers a received signal (codeword) in accordance with this modified minimum distance decoding approach, then choices can arise in assigning the estimated codeword, and may even warrant some variation of the basic approach. If the weight W is greater than or equal to $d_{min}$, it is possible that a W-weight error pattern will yield identification of multiple codewords (e.g., not arrive at a unique codeword solution). Stated another way, more than one codeword can be within $d_{min}$ Hamming distance from a received signal (codeword).

For example, it may be considered that signaling codewords $i_1$ and $i_2$ can compare with received signal (codeword) j and produce error patterns $(i_1, j)$ and $(i_2, j)$, respectively. Let codeword $i_1$ be the all zero codeword, and codeword $i_2$ be a codeword with only $d_{min}$ nonzero bits (or symbols), and consider that codeword $i_1$ is transmitted and received without errors. There exists one test error pattern of $W=d_{min}$ that will cover both of these codewords, and this is the test pattern that has error positions in the same positions where codeword $i_2$ has nonzero bits (or symbols). Error pattern $(i_2, j)$ will have $d_{min}$ error positions while error pattern $(i_1, j)$ has zero errors. Both of these error patterns are covered by the test error pattern as described, and has weight, $W=d_{min}$.

It is noted that the error pattern $(i_1, j)$ has zero errors and thus was covered by many test error patterns in the decoding approach before the weight W, in accordance with being incremented, reached $d_{min}$. However, the decoding approach would continue searching, and appropriately increasing the weight W, if the attempted test error patterns did not cover at least one of the other of the M−1 received signals (codewords). In other words, it is required that one test error pattern cover all M of the received signals (codewords) in order to terminate the operation and select the estimated signal (codeword) (e.g., in at least one embodiment previously described). In one embodiment here, it is assumed for the example that a test error pattern having weight $d_{min}$ is required to cover the full set of M received signals (codewords). This is why the processing can continue, and end in a situation where any one of the received signals (codewords) may have several values of "i" for which error pattern (i, j) is covered by the test error pattern, leading to a plurality of possibilities for the resulting estimated codeword.

In this case, and other cases operating using multiple codewords associated with the covering error pattern and a given received codeword, such as with nonbinary symbols in the coding, several options are possible in directing the selection of the actual estimated codeword for the for the given received signal (codeword). In one embodiment, the estimated codeword is selected as being the codeword with the minimum Hamming distance from the received signal (codeword). Another embodiment operates in accordance with randomly selecting the estimated codeword from among the possible candidate codewords. In one embodiment, the probability of error of the symbols in error are not equal, so the most likely value of symbols (among those symbols in error) can be assigned until there are few enough remaining unassigned symbols in error to perform erasure decoding. Applying this technique multiple times, choosing different positions having error for assignment, an ensemble of erasure-decoded codewords is generated and the probabilities of the various resulting values in the positions having error could be used for selection of the final decoding choice. In another embodiment the error statistics of positions having error in received codewords which are decoded without ambiguity are applied, as described below.

In some instances, there may be a number of codewords each having the same minimum Hamming distance from the received signal (codeword), which may then result in random assignment selecting among just this subset of the codewords. Still yet another embodiment operates by examining the error patterns in the set of M received signals (codewords) which are uniquely decoded by the modified minimum distance decoding approach, and those results are used in selecting the estimated codewords for those received signals (codewords) where any such "ties" may exist or occur. More details of this approach and similar approaches are provided below. Other options also exist for handling multiple possible estimated codewords for a single received signal and single "covering" test error pattern, which will be discussed further below.

Another embodiment is directed towards solving ambiguities via solving for the correct values in the identified error locations. For example, with non-binary codes, ties may exist with the modified error distance decoding because many codewords in the full list of codewords may share the same error positions in comparison to one received codeword (e.g., when the number of error positions is at least $d_{min}$). as the reader may recall, the error positions of a selected codeword, compared to the received codeword, is a subset of the error positions in the covering pattern, and may be a proper subset. Thus, decoding may involve using erasure decoding and using only the error locations associated with a particular codeword and assuming the remaining positions are correct (when the number of error positions allows erasure decoding), rather than using all the error positions of the covering error pattern.

When the covering error pattern is weight $d_{min}-1$ or less, then with Reed-Solomon (RS) codes, as an example, it is possible to recover the actual codeword associated with the received codeword just by knowing the value of the received codeword in the positions outside the error positions. Thus a huge simplicity may be incorporated into the operations shown with reference to FIG. 7, FIG. 8, and FIG. 9, for storing the information associated with test error patterns of weight less than $d_{min}$. In these cases it is only necessary to store the error locations (and number of errors can be stored or counted from this) in association with each received signal (codeword). Similarly, since with many codes, including RS codes, when one codeword is found which differs from the received codeword in $d_{min}$ positions or more, there is an entire vector space of codewords which have the same error pattern, and these can be generated from just the values in the matching symbols and the positions of the different symbols. Thus, once again, in this case in one embodiment it is beneficial to only store the error positions in the operation where error values are computed and stored.

It is also possible that if a test error pattern of weight W is found which "covers" $m_1$ of the M received codewords, e.g., where $M>m_1 \geq m_{thresh}$, then the decoding will operate on the $m_1$ codewords, and separately (or subsequently) operate on the remaining $M-m_1$ received codewords (e.g., such as in accordance with FIG. 8).

Again, there are variations and options for handling the decoding of the remaining codewords. It could simply be that these codewords are decoded in accordance with the approaches such as described with respect to FIGS. 7, 8, and/or 9, but with $M'=M-m_1$. When the codewords are amenable to erasure decoding or iterative decoding (e.g., such as with likelihood ratios or log-likelihood ratios (LLRs), then the remaining uncovered codewords can be attempted to be decoded with erasures or likelihood ratios (or LLRs) reflecting low or no certainty in the covered positions.

A variation would be as follows: for a received signal (codeword) j which is among the M' received signals not covered by the test error pattern which does cover $m_1$ of the received signal, the test error pattern can be compared to identify the $m_1$ received signals (codewords) to each respective test error pattern (i, j), and can then determine in each case $e_{i,j\_not\_covered}$, which is the number of errors in the error pattern (i,j) which are not covered by the identified test error pattern.

In other words, $e_{i,j\_not\_covered}$, is the number of errors which exist outside of the test error pattern selected for the $m_1$ received signals (codewords), in comparing the $i^{th}$ codeword with the $j^{th}$ received signal. This number is computed for each codeword, in the list of candidate codewords (which may be the exhaustive list of codewords), for each received signal which is not among the $m_1$ received signals which are covered by the selected test pattern. If it is known that $e_{i,j\_not\_covered}>0$ for each i, then the test error pattern is not covering. The signaling codeword #i corresponding to the minimum $e_{i,j\_not\_covered}$ is then selected, as the estimated codeword for received signal (codeword) j. If there are "ties," then random selection could be done, or selection based on minimum overall Hamming weight (e.g., not every position within the test error pattern is likely to be in all the tied error pattern (i, j)'s), etc.

Another variation of the modified minimum distance decoding approach could be to examine the combination of (1) weight W of the test error pattern, and (2) the number of codewords $m_1$ out of the M which are successfully covered, as the approach progresses. For acceptable pairs (W, $m_1$), the modified minimum distance decoding approach could be operated as described above. Decoding on the remaining M–$m_1$ received signals (codewords) as described above is one embodiment. Other embodiments are of course possible without departing from the scope and spirit of the invention. The remaining M–$m_1$ received signals (codewords) could be grouped with other received signals (codewords) outside the set of M originally processed signals (codewords).

Expanding on the variant embodiment as described above, another parameter, $e_{j\_emain}$, can be determined for a test error pattern and received signal (codeword) j, which corresponds to the minimum value (minimized over i) of $e_{i,j\_not\_covered}$. With this additional parameter being added to the modified minimum distance decoding approach, the processing continues until an acceptable combination is reached for the values (1) weight W of the test error pattern, (2) number of codewords $m_1$ out of M which are successfully covered, and (3) $e_{j\_remain}$ is no greater than $e_{remain\_thresh}$ for all M–$m_1$ codewords which are not covered.

In this case, the $m_1$ codewords which are covered have their estimated codewords selected as in the basic approach, and the remaining M–$m_1$ codewords have selected as their respective, estimated codewords those codewords i which correspond to the minimum $e_{i,j\_not\_covered}$. This particular variant of the modified minimum distance decoding approach may be understood with respect to FIG. 9. It is noted that one embodiment involving codewords is amenable to decoding via erasure decoding, or accepting of varying starting likelihood ratios associated with each bit position, and/or associated with iterative decoding methods, as associated in accordance with the approach of the FIG. 10.

Rather than attempting to identify and cover all the errors in the M received signals, the approach in FIG. 9 is exercised to identify potential error positions which are common among a number (e.g., $m_1$) of the M received signals (codewords), and that outside of these common positions in the $m_1$ received signals (codewords), there may be some but not too many other potential error positions in each.

Another variant embodiment occurs when a test error pattern of weight W is found which covers all M received codewords. The approach can be considered completed successfully at this point, or further test error patterns of weight W may be processed until all weight W test error patterns are exhausted. If this option is selected, and if this results in at least one different estimated codeword for the j received codewords, then "tie break" procedures would be invoked (along the lines of those outlined above, plus other "tie break" procedures are envisioned).

Another variation of the decoding approach, discussed below, addresses the shifting of the test error pattern as employed in accordance with FIG. 7 by one position for $j \geq j_{burst\_start}$ in making the cover testing, to account for burst impact arriving in a middle row of the interleaver, such as illustrated in accordance with FIG. 6.

Also, in some embodiments, a variant embodiment of that described with respect to FIG. 7 is, for each received signal j, to determine the minimum Hamming weight (minimizing over i) of each error pattern (i,j). Then, the decoding operates to determine the maximum of this value over j, $E_{max\_min}$. This value, $E_{max\_min}$, is the minimum weight possible for a covering test error pattern, so it may be an advantage in some implementations to make these calculations and begin the decoding approach's search for a covering test error pattern with $$W=E_{max\_min}=\max \text{ over } j\{\min \text{ over } i(\text{Hamming weight of error pattern}(i,j))\}.$$

It is noted that if $E_{max\_min} < [(d_{min}-1)/2]$, where [ ] denotes rounding down to an integer, then the minimum distance decoding approach such as described with respect to FIG. 3 individually for each received codeword could be considered. However, the modified error distance decoding approach in some circumstances can provide for superior performance.

When comparing the error distance decoding approach with the modified error distance decoding approach, it may be noted that the modified error distance decoding approach can provide a significant performance improvement over the error distance decoding approach when applied to individually received signals (codewords).

For example, consider an embodiment in which $d_{min}=5$, and considering two codewords therein, such that codeword #1=all zeroes=(0 0 0 0 0 0 . . . ) and codeword #2=all ones=(1 1 1 1 1 0 . . . ). Consider that codeword #2 is transmitted as the first of M transmitted signals (codewords), but received as (0 0 0 0 1 0 . . . ) (e.g., with at least one bit error therein). The error distance decoding approach will provide codeword #1 (all zeroes) as the estimated codeword, which would unfortunately be wrong in that case. If there are other codewords in the set of M received codewords which contain errors in the first four positions, but not in any other positions, then the test error pattern (0 0 0 0 E 0 . . . ) covers the first received codeword, but does not cover all of the other received codewords. Therefore the approach has to proceed beyond weight of W=1.

If over the set of the other M–1 received codewords there is at least one transmission error in each of the first four positions, then the approach will proceed to W=4 and the test error pattern (E E E E 0 0 . . . ) will cover all M of the received codewords. In particular, this test error pattern covers the first received codeword when compared with codeword #2.

This will provide for decoding the first received signal (codeword) as (1 1 1 1 1 0 . . . ), which is codeword #2, with the determination that the first five positions were received in error. This exemplary embodiment shows the decoding beyond the error distance decoding approach with this novel decoding technique, in accordance with its effective modified error distance, is beneficial and operative to mitigate (if not eliminate) deleterious effects such as burst noise and/or other impairments that may affect a communication channel (e.g., that may include interleaving such that the burst impacted symbols are the same symbols in each of the M codewords).

Another embodiment may provide for estimating the error probability of the four positions associated with a possible burst noise event from the other received signals (codewords) in the group, and also estimating the error probability of the single position which is associated with the distance one codeword, using the other received codewords in the group. From these estimated probabilities, and assuming equal likelihood of transmitting either codeword #1 or #2 in the example, applying Bayes law with the probability estimates for the various symbol positions will yield which of the two codewords was most likely to have been transmitted in the environment or communication channel characterized by the transition probabilities empirically derived from the other codewords in the group.

A variation of the approach of the error distance decoding approach (such as described with reference to FIG. 7), and described above which includes calculation of the parameter, $e_{j\_remain}$, for a given test error pattern and received codeword j (which corresponded to the minimum value (minimized over i) of $e_{i,j\_not\_covered}$) is described with respect to FIG. 9.

One particular embodiment within this family of error distance decoding embodiments entails using the approach of FIG. 7, but for each test error pattern determining $e_{j\_remain}$, and then terminating the approach (successfully) when a test error pattern is found such that $$W+2\times e_{j\_remain} < d_{min} \text{ for each } j \in \{1, \ldots, M\}. \quad \text{[Test A]}$$

Another embodiment within this family of variations would use the approach of FIG. 7 up to $W=d_{min}-1$, and if no covering test error pattern has been found, then to begin reducing W by one at a time and use Test A above to determine an acceptable "almost covering" test error pattern.

Clearly, the results and test error patterns, etc. associated with Test A may be determined and stored as W is incremented, so that the reverse stepping down need not be repeated. In this case, the results (for the largest successful W for Test A) would be available. As W is incremented (e.g., in accordance with the approach of FIG. 7), when a successful result for Test A is found it is saved. If a subsequent successful result is found for a larger W, it replaces the saved result. If W proceeds to $d_{min}-1$ without finding a covering test error pattern, then the available last saved successful Test A provides an "almost covering" test error pattern.

With respect to embodiments that perform soft decision demodulation, the approach depicted with reference to FIG. 7 (and FIG. 8, 9, etc.) can be applied to receivers operating with demodulators (or even inner code decoders) which are capable of generating soft decisions for bits or symbols. De-interleaving the soft decisions will result in a row and column arrangement as depicted in FIG. 6 (or alternatively, FIG. 11 and FIG. 14 for different types of signaling), but with the hashed positions representing positions, generally speaking, with degraded likelihood ratios compared to other positions.

The embodiment described in accordance with FIG. 7 (and FIG. 8, 9, etc.) can proceed as shown but rather than requiring working through all possible codewords in a list (e.g., such as an exhaustive list), likelihood ratios which reflect a given amount of uncertainty for a position are considered "errored" in the approach, and a covering test error pattern is sought. This approach is especially amenable to the approach of FIG. 9, wherein it is not necessary to cover all the errors in each received signal, but rather it is only necessary to find a test error pattern of some weight W, covering some number (perhaps all M) of the received signals, except for some few straggling positions in one or several or many of received signals (codewords), and a suitable combination of low weight W, many received signals (perhaps all in this embodiment) and few number of straggling positions is sought. Once the test error pattern is found, the positions of the test pattern in all received codewords are assigned low (or completely uncertain) likelihood ratios, and erasure decoding and/or iterative decoding and/or convolutional decoding is commenced for each received codeword. In other words, in this embodiment this is an approach for detecting low channel fidelity, and then applying this detected channel condition, as described in a previous teaching (Detection and mitigation of temporary impairments). A variant embodiment may assign erasure or low likelihood ratio to the straggling error positions, those positions in received codewords which have low likelihood ratio from the demodulator but are not covered by the selected test error pattern.

With respect to communication systems embodiments that operate using convolutionally encoded codewords, the decoding approach as described with respect to FIG. 7 (and FIG. 8, 9, etc.) can be applied thereto. Unwrapping the convolutionally encoded and interleaved signal as prescribed by the de-interleaver will result in a row and column arrangement as depicted with respect to FIG. 6, but generally speaking, with the hashed positions representing positions with degraded likelihood ratios compared to other positions.

The modified minimum distance decoding approach also can provide for a significant reduction in complexity compared to the minimum distance decoding approach, wherein the latter requires at least compiling a list of candidate codewords for each received signal and proceeding through the comparisons with test patterns. No such list is necessary for the application of the embodiment described above that operates in accordance with performing soft decision demodulation.

Another variation of the approach decoding approach as described with respect to FIG. 7 (and FIG. 8, 9, etc.) is firstly to apply an iterative decoder, or a stack decoder (or variation or equivalent thereof) for a convolutionally encoded signal. With the stack decoder (or variation thereof) when the stack decoding approach gets burdened with too many survivors (e.g., possible estimate signals), then these partial decoding results can feed the approach. Alternatively, with iterative decoding, when a given number of iterations is reached without a converged result, or if some other metric of decoder progress is not satisfied, comparison of the positions which are varying among the iterations provides a partial decoding result which may be fed to the approach in lieu of actual candidate codewords and the differences between that candidate codewords and a received signal (codeword).

These survivors (referring to the stack decoding, or variation thereof) are basically candidate codewords (in combination with the convolutional decoder employing some degree of look back) which have the highest probability overall, at that point in the decoding process. Thus these partial decoding items are excellent candidates for inputting into the decoding approach of FIG. 9 as candidate codewords.

Similarly, the various recent iterations in an iterative decoding approach can be compared for their difference positions, and these positions which are varying are identified as error positions (taking the place of the rigorous comparison of an actual valid codeword with the received signal). By comparing a plurality of recent iteration results (for each received codeword) pairwise, each received codeword may be used to generate a respective number of error position sets. Each respective error position set is used in accordance with comparison with a test error covering pattern. When a test error covering pattern is found which satisfies the conditions on W, $m_1$, and $e_{j\_remain}$, then the covered error positions can have their likelihood ratios (or LLRs) set to low value or completely uncertain, and iterative decoding commenced from that point.

Figure 10:
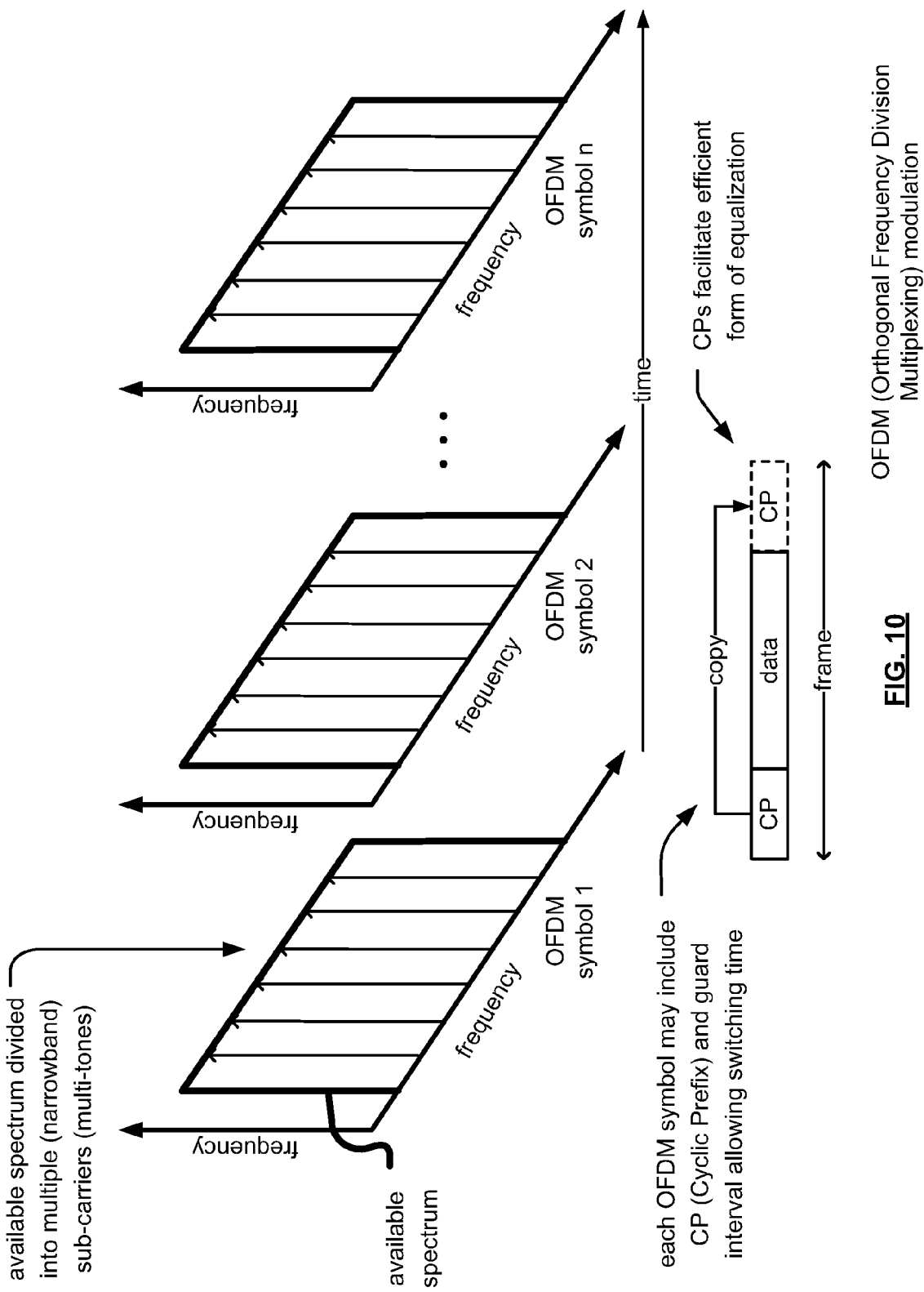
FIG. 10 is a diagram illustrating an embodiment of OFDM (Orthogonal Frequency Division Multiplexing) modulation.

FIG. 10 is a diagram illustrating an embodiment of OFDM (Orthogonal Frequency Division Multiplexing) modulation. OFDM modulation may be viewed a dividing up an available spectrum into a plurality of narrowband sub-carriers (e.g., lower respective data rate carriers). Typically, the frequency responses of these sub-carriers are overlapping and orthogonal with respect to each other. Each sub-carrier may be modulated using any of a variety of modulation coding techniques.

OFDM modulation operates by performing simultaneous transmission of a larger number of narrowband carriers (or multi-tones). Oftentimes a guard interval or guard space is also employed between the various OFDM symbols to try to minimize the effects of ISI (Inter-Symbol Interference) that may be caused by the effects of multi-path within the communication system (which can be particularly of concern in wireless communication systems). In addition, a CP (Cyclic Prefix) may also be employed within the guard interval to allow switching time (when jumping to a new band) and to help maintain orthogonality of the OFDM symbols.

Other benefits are achieved using OFDM. For example, the use of multi-tones allows for an effective solution to deal with narrowband interference. For example, a tone that corresponds to the locality of the narrowband interference may be turned off (to eliminate the susceptibility to this narrowband interference) and still provide for efficient operation. This turning off of these one or few tones will not result in a great loss of bandwidth because each individual tone does not occupy a great deal of bandwidth within the available spectrum employed by the OFDM symbol.

Figure 11:
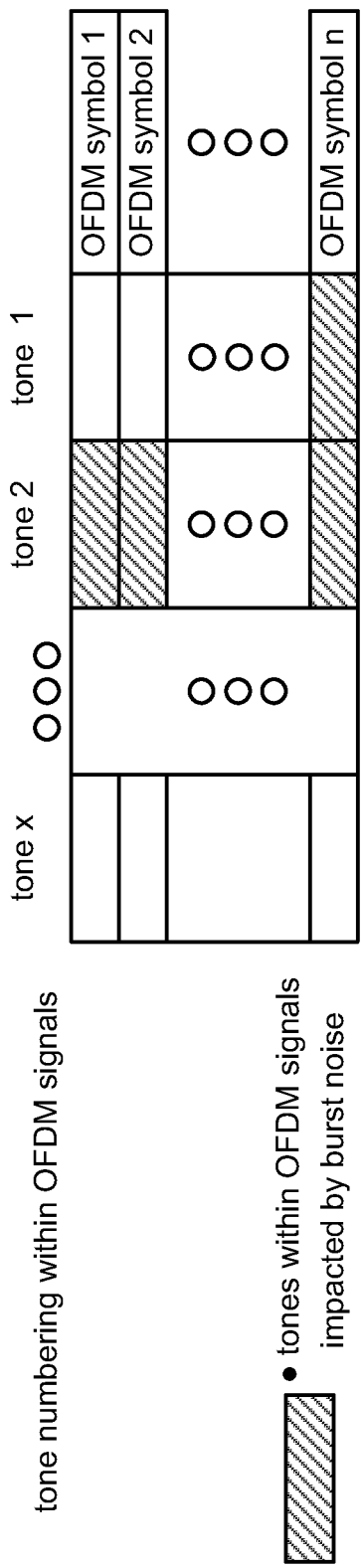
FIG. 11 is a diagram illustrating an embodiment of different respective tones in accordance with OFDM modulation being undesirable affected by burst noise, distortion, and/or other deleterious effects.

FIG. 11 is a diagram illustrating an embodiment of different respective tones in accordance with OFDM modulation being undesirable affected by burst noise, distortion, and/or other deleterious effects. As mentioned elsewhere herein, it is noted that any type of signaling scheme in which multiple 'signals' are affected commonly by a deleterious event (e.g., burst noise, distortion, etc.) may be operated in accordance with various aspects and principles, and their equivalents, of the invention. Also, such multiple 'signals' can be of various forms and types within such alternative signaling schemes. This embodiment shows how, in accordance with OFDM signaling, commonly located tones within different OFDM symbols may be commonly affected by such a deleterious event that affects multiple OFDM symbols. As may be seen, not all of the tones within respective OFDM symbols are necessarily affected by such a deleterious event, but those tones which are affected across multiple OFDM symbols are commonly located in at least some (two or more) of the respective OFDM symbols.

Figure 12:
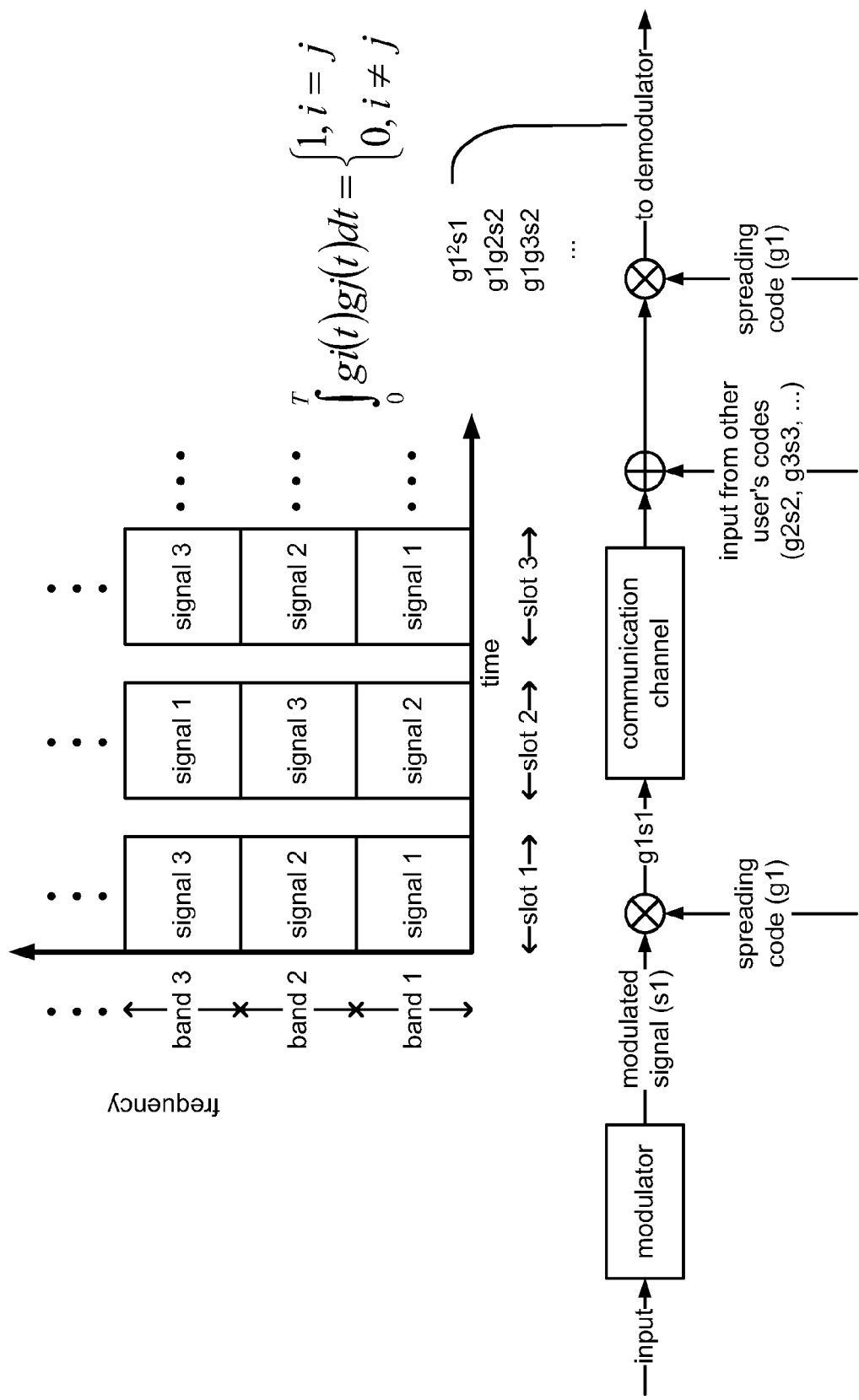
FIG. 12 is a diagram illustrating an embodiment of CDMA (Code Division Multiple Access) signaling.

FIG. 12 is a diagram illustrating an embodiment of CDMA (Code Division Multiple Access) signaling. CDMA may be viewed as the short term assignment of a frequency band to various signal sources. At each successive time slot, the band assignments are reordered either adaptively or according to a predetermined sequence. For example, during a time slot 1, a signal 1 operates using a band 1, a signal 2 operates using a band 2, and a signal 3 operates using a band 3. Then, during a time slot 2, the signal 1 operates using the band 3, the signal 2 operates using the band 1, and the signal 3 operates using the band 2. During a time slot 3, the signal 1 operates using the band 1, the signal 2 operates using the band 2, and the signal 3 operates using the band 3.

The operation of communication devices (e.g., users) is performed using a spreading code (SC) that is typically orthogonal to the other SCs employed by the other communication devices within the communication system. Such a SC may be of a variety of types including a pseudo-noise (PN) code. A modulated signal is spread using that SC and the spread signal is then transmitted across a communication channel (e.g., any desired such type of communication channel including those described with reference to FIG. 1). At a receiver end of the communication channel, this same SC is employed to de-spread the signal so that data sent from a particular device may be demodulated by the appropriate destination device.

The operation of CDMA may be better understood when viewed as the transformation of an input signal through a communication system. At a transmitter end of a communication channel, input from a particular user is first provided to a modulator where the data is modulated by a carrier thereby generating a modulated signal (s1). Next, the data-modulated signal is then multiplied by a spreading code (g1) that corresponds to that particular user thereby generating a spread signal (g1s1) that is then provided to the communication channel. This signal may be viewed as a convolution of the frequency spectrum of the modulated signal and the frequency spectrum of the spreading code. Simultaneously, input from other users within the communication system is modulated and spread in an analogous manner.

At the receiver end of the communication channel, a linear combination of all of the spread signals provided by the other users is received, e.g., g1s1+g2s2+g3s3+ . . . and so on for all of the users. At the receiver end, the total received signal is then multiplied by the spreading code (g1) thereby generating a signal that includes $g1^2s1$ plus a composite of the undesired signal (e.g., g1g2s2+g1g3s3+ . . . and so on).

In CDMA, the spreading codes are typically chosen such that they are orthogonal to one another. That is to say, when any one spreading code is multiplied with another spreading code, the result is zero. This way, all of the undesired signals drop out. Given that the spreading codes g1(t), g2(t), g3(t) and so on, the orthogonality of the spreading codes may be represented as follows:

$$\int_0^T gi(t)gj(t)dt = \begin{cases} 1, & i = j \\ 0, & i \neq j \end{cases}$$

This final signal is then passed to a demodulator where the input that has been provided at the transmitter end of the communication channel is extracted and a best estimate is made thereof.

Figure 13:
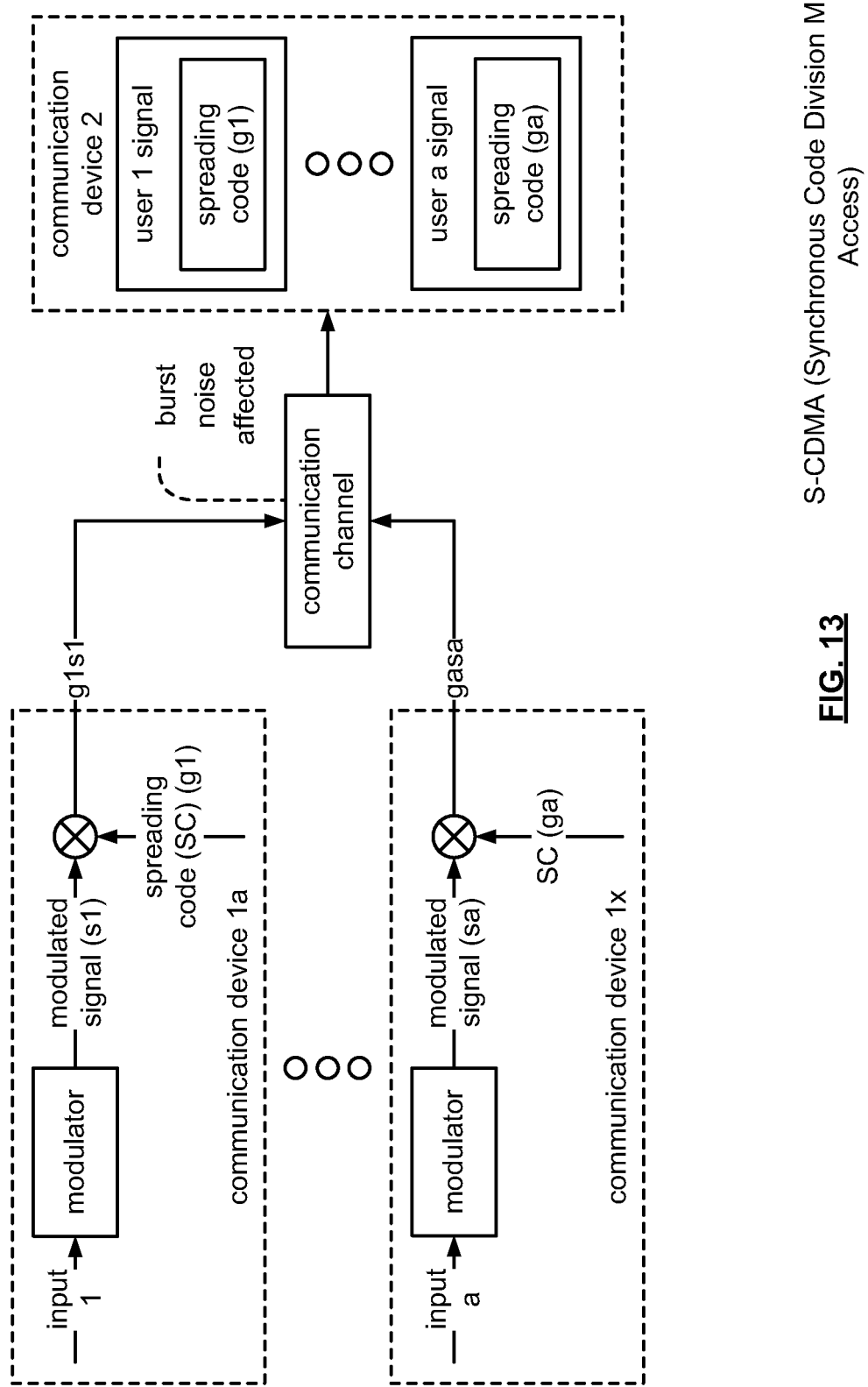
FIG. 13 is a diagram illustrating an embodiment of synchronous code division multiple access (S-CDMA) signaling.

FIG. 13 is a diagram illustrating an embodiment of synchronous code division multiple access (S-CDMA) signaling. This embodiment shows communication between a number of communication devices (shown as communication devices 1a through communication device 1x) and communication device 2. While communication is shown as going from the communication devices 1a-1x to the communication device 2, it is of course noted that bi-directional communications may be supported in accordance with such a communication system.

Each of the communication devices 1a-1x is able to communicatively couple to a communication channel (either directly or indirectly). A number of elements may be included within the communication channel as the reader will understand. For example, routers, splitters, couplers, relays, and amplifiers may be contained within the communication channel without departing from the scope and spirit of the invention.

The communication channel allows communicative coupling between the communication devices 1a-1x and the communication device 2. The communication device 2 is able to receive the appropriate input user signals of each of the communication devices 1a-1x. For example, the communication device 2 is able to communicate respective user signals corresponding to the respective communication devices 1a-1x.

For each of the respective user signals, the communication device 2 may also be able to perform transmit equalization to guarantee a nearly perfect single-path overall channel. The transmit equalizer taps at a specific communication device 1a (through 1*x*) are usually set according to an estimate of the channel between that respective communication device and the communication device 2, which can be estimated during the ranging process. In addition, the communication device 2 may be able to perform signal spreading of each of these user signals from the communication devices 1*a*-1*x* as well. While this embodiment depicts the signal spreading using one respective spreading code (SC) for each of the respective communication devices 1*a*-1*x*, this signal spreading may alternatively involves employing two separate codes to do the spreading, an outer spreading code (e.g., applied to all of the communication devices 1*a*-1*x*) and respective inner spreading cods (e.g., individually and respectively applied to each of the communication devices 1*a*-1*x*, one SC for each respective communication device 1*a* through 1*x*). For example, the communication device 2 may be able to perform transmit equalization for the respective user signals. In addition, the communication device 2 may be able to perform signal spreading that involves employing both an outer code and an inner code (analogously as performed on the communication end of the communication devices 1*a*-1*x*). Then, the respective communication devices 1*a*-1*x* are able to perform signal de-spreading of all employed spreading codes of their respective received user signals.

FIG. 14 is a diagram illustrating an embodiment of different respective bit (or symbols) in accordance with S-CDMA signaling being undesirable affected by burst noise, distortion, and/or other deleterious effects. As mentioned elsewhere herein with respect to other embodiments, it is again noted that any type of signaling scheme in which multiple 'signals' are affected commonly by a deleterious event (e.g., burst noise, distortion, etc.) may be operated in accordance with various aspects and principles, and their equivalents, of the invention. Also, such multiple 'signals' can be of various forms and types within such alternative signaling schemes. This embodiment shows how, in accordance with S-CDMA signaling, commonly located bits within different user signals symbols may be commonly affected by such a deleterious event that affects multiple user signal. As may be seen, not all of the tones within respective user signals are necessarily affected by such a deleterious event, but those bits which are affected across multiple user signals are commonly located in at least some (two or more) of the respective user signals.

With respect to this embodiment operating in accordance with S-CDMA signaling, as well as the OFDM signaling embodiment of FIG. 11, or the interleaving related embodiment of FIG. 6, it is noted that the affected portions thereof need not necessarily be adjacent to one another or contiguous. For example, in the interleaving related embodiment of FIG. 6, the affected bits need not all be adjacent/contiguous, and more than one deleterious event can affect different, non-adjacent/non-contiguous portions within the respective codewords. Similarly, non-adjacent/non-contiguous portions within more than one OFDM symbol (e.g., FIG. 11) or non-adjacent/non-contiguous portions within more than one user signal (e.g., FIG. 14) may be handled in accordance with various aspects and principles, and their equivalents, of the invention.

Moreover, with respect to and in accordance with various aspects and principles, and their equivalents, of the invention, it is noted that erasure decoding could be attempted for the set of $M-m_1$ received signals (codewords), erasing the positions of the test error pattern, and using the result as the estimated codewords for these $M-m_1$ received codewords. Other variations are also possible.

The explanation of such a decoding processing technique is most clearly made with the assumptions (1) the decoder uses optimal decoding and is capable of correcting all instances of t errors in a codeword, (2) only one burst event will occur during an interleaver block, (3) in this case the FEC is a binary code, so that each codeword symbol is a single bit, and (4) a burst event will impact more than t bits in each codeword (e.g., such as in accordance with each row in the de-interleaver embodiment described with respect to FIG. 6), and (5) during a burst error event the bit probability of error is 0.5 and during "normal" channel conditions the probability of error is 0.

With these assumptions, it may be seen that if a burst condition occurs, there is a significant probability that at least one codeword suffers more than t errors. If there are Nb bits impacted by the burst noise (and it is given that Nb>t), then the probability t+1 errors in a codeword is Prob(t+1 bit errors)=$C(Nb,t+1) \times 2^{-(Nb)}$, where $C(Nb,t+1)$=combinations of t+1 items out of Nb. Assuming the current art of decoding, for even modest values of Nb, this represents an unacceptably high probability of decoding error. The only hope would then be that the burst events would happen rarely, or be much shorter duration, but this is not the case in many communication channels. Longer interleaving would be beneficial and mitigate this error rate, but this represents a tradeoff in some applications for latency and/or implementation complexity, and the larger interleaving size simply pushes out the burst duration that will in fact impact performance.

The reader may understand the many benefits and application of modified minimum distance decoding in accordance with various aspects and principles, and their equivalents, of the invention. It is noted that the calculations of certain of the examples above apply to non-binary coding schemes, with even the same probabilities of symbol error being a reasonable approximation to realistic cases.

Firstly, it is possible that within a group of signals (codewords) impacted by burst noise which overwhelms the decoder such that there is almost certainty that one or more received signals (codewords) will be uncorrectable even when the positions potentially impacted by a burst error is known (e.g., because there may simply be too many errors within those positions, e.g., $d_{min}$ or more), it is also possible that it is likely that one or more codewords can be decoded using conventional means (e.g., because they will have t or fewer error positions), and further that many of the codewords can be decoded once the positions potentially impacted by burst noise are known (e.g., the covering error pattern), e.g., fewer than $d_{min}$ errors.

Being able to decode one or several received signals (codewords) in the group by conventional means, and then identifying the error positions in those received codewords, can provide significant advantage in starting a list of candidate codewords to consider in a truncated list approach. Even without such decodable codewords (e.g., such as by conventional means), applying the methods for generating candidate codewords which have been described in literature and the art, and/or using statistical means as taught in U.S. Utility application Ser. No. 10/000,415, entitled "Detection and mitigation of temporary impairments in a communications channel," now U.S. Pat. No. 7,308,050, referenced above, blocks of potential error positions can be identified. The methods for generating codewords for the truncated list of candidate codewords can be modified to generate candidate codewords which preferentially have errors compared to a received codeword which are preferentially within the identified burst error positions. A brute force method is to erase some number of positions (fewer than $d_{min}-1$ or even less) within an identified potential burst position and attempt decoding. Those positions which (from their probabilities entering the decoding process) are most uncertain are those erased first in this trial-and-error procedure; it may be that several or many such decoding attempts are tried before a successful decoding is determined, generating a new codeword in the list of candidates.

After finding one such codeword, other candidate codewords can be generated by adding codewords of minimum and near-minimum distance, which have most of their errors contained within the pre-existing limits of the burst noise (already found for this group). Bootstrapping in this fashion through the group of received codewords will generate candidate codewords. Of course, this approach has the possibility of being misled by early decoding results (e.g., if they are anomalies and not truly representative of the positions impacted by burst noise), but this can be mitigated by a variety of means including performing using more calculations, allowing more trials, etc. Other approaches, including algebraic approaches, may be available to generate a covering error position set which satisfies the modified error distance metric for a group of codewords, in accordance with various aspects and principles, and their equivalents, of the invention and after finding the covering error positions for the set, the determination of the selected codeword for each given received signal (codeword) proceeds in accordance with various aspects and principles, and their equivalents, of the invention.

It is noted that the various modules and/or circuitries (e.g., for encoding, decoding processing, processing of signals, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory (ROM), random access memory (RAM), volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

Terms such as "circuit", "circuitry", and/or their equivalents, etc. as used herein may refer to an independent circuit or to a portion of a multifunctional circuit that performs multiple underlying functions. For example, depending on the embodiment, processing circuitry may be implemented as a single chip processor or as a plurality of processing chips. Likewise, a first circuit and a second circuit may be combined in one embodiment into a single circuit or, in another embodiment, operate independently perhaps in separate chips. The term "chip," as used herein, refers to an integrated circuit. Circuits and circuitry may comprise general or specific purpose hardware, or may comprise such hardware and associated software such as firmware or object code.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences.

As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to." That is to say, it is also noted that any of the connections or couplings between the various modules, circuits, functional blocks, components, devices, etc. within any of the various diagrams or as described herein may be differently implemented in different embodiments. For example, in one embodiment, such connections or couplings may be direct connections or direct couplings there between. In another embodiment, such connections or couplings may be indirect connections or indirect couplings there between (e.g., with one or more intervening components there between). Of course, certain other embodiments may have some combinations of such connections or couplings therein such that some of the connections or couplings are direct, while others are indirect. Different implementations may be employed for effectuating communicative coupling between modules, circuits, functional blocks, components, devices, etc. without departing from the scope and spirit of the invention.

As may even further be used herein, the term "operable to" and/or "operative to" indicates that an item includes one or more of power connections, input(s), output(s), etc., to perform one or more its corresponding functions and may further include inferred coupling to one or more other items. As may still further be used herein, the term "associated with," includes direct and/or indirect coupling of separate items and/or one item being embedded within another item. As may be used herein, the term "compares favorably," indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A method for operating a communication device, comprising:
    identifying a first test error pattern, having a weight, that covers at least one commonly located bit within each of a plurality of signals;
    applying the first test error pattern to each of the plurality of signals thereby generating first respective sets of possible signals, such that each one of the respective first sets of possible signals corresponding to a respective one of the plurality of signals;
    modifying the weight of the first test error pattern thereby generating a second test error pattern;
    applying the second test error pattern to each of the plurality of signals thereby generating second respective sets of possible signals, such that each one of the respective second sets of possible signals corresponding to a respective one of the plurality of signals; and
    for each of the plurality of signals, selecting a respective one possible signal from its respective first set of possible signals or its respective second set of possible signals as being an estimate thereof.

2. The method of claim 1, wherein:
    the plurality of signals being a plurality of codewords having respective information bits encoded therein in accordance with at least one error correction code (ECC).

3. The method of claim 1, further comprising:
    receiving a transmitted signal from a communication channel;
    extracting the plurality of signals from the transmitted signal; and
    decoding the selected, respective one possible signal thereby generating an estimate of at least one information encoded within the transmitted signal.

4. The method of claim 1, wherein:
    the plurality of signals being a plurality of partial decoding results generating in accordance with partial decoding of at least one additional signal.

5. The method of claim 1, wherein:
    the plurality of signals being a plurality of orthogonal frequency division multiplexing (OFDM) symbols communicated in accordance with OFDM signaling.

6. The method of claim 1, wherein:
    the plurality of signals being a plurality of symbol sets each corresponding to a respective spreading code communicated in accordance with synchronous code division multiple access (S-CDMA) signaling.

7. The method of claim 1, further comprising:
    for each of the plurality of signals, randomly selecting its respective one possible signal from its respective first set of possible signals or its respective second set of possible signals as being its respective estimate thereof.

8. The method of claim 1, wherein:
    for each of the plurality of signals, selecting its respective one possible signal based on its respective one possible signal having a smallest minimum distance among its respective first set of possible signals or its respective second set of possible signals.

9. The method of claim 1, further comprising:
    receiving a transmitted signal from a communication channel;
    extracting the plurality of signals from the transmitted signal; and wherein:
    the plurality of signals being a subset of all signals extracted from the transmitted signal.

10. The method of claim 1, further comprising:
    receiving a transmitted signal from a communication channel;
    extracting the plurality of signals from the transmitted signal; and wherein:
    during transmission via the communication channel, at least one of burst noise and distortion being incurred within the transmitted signal thereby deleteriously affecting the at least one commonly located bit within each of the plurality of signals.

11. The method of claim 1, wherein:
    the communication device being operative within at least one of a satellite communication system, a wireless communication system, a wired communication system, and a fiber-optic communication system.

12. A method for operating a communication device, comprising:
    receiving a transmitted signal from a communication channel;
    extracting a plurality of signals from the transmitted signal;
    identifying a first test error pattern, having a weight, that covers at least one commonly located bit within each of the plurality of signals;
    applying the first test error pattern to each of the plurality of signals thereby generating first respective sets of possible signals, such that each one of the respective first sets of possible signals corresponding to a respective one of the plurality of signals;
    modifying the weight of the first test error pattern thereby generating a second test error pattern;
    applying the second test error pattern to each of the plurality of signals thereby generating second respective sets of possible signals, such that each one of the respective second sets of possible signals corresponding to a respective one of the plurality of signals;

for each of the plurality of signals, selecting a respective one possible signal from its respective first set of possible signals or its respective second set of possible signals as being an estimate thereof; and decoding each of the selected, respective one possible signals thereby generating a plurality of estimates of a plurality of information bits encoded within the transmitted signal.

13. The method of claim 12, wherein:
the plurality of signals being a plurality of orthogonal frequency division multiplexing (OFDM) symbols communicated in accordance with OFDM signaling.

14. The method of claim 12, wherein:
the plurality of signals being a plurality of symbol sets each corresponding to a respective spreading code communicated in accordance with synchronous code division multiple access (S-CDMA) signaling.

15. The method of claim 12, wherein:
during transmission via the communication channel, at least one of burst noise and distortion being incurred within the transmitted signal thereby deleteriously affecting the at least one commonly located bit within each of the plurality of signals.

16. The method of claim 12, wherein:
the communication device being operative within at least one of a satellite communication system, a wireless communication system, a wired communication system, and a fiber-optic communication system.

17. An apparatus, comprising:
an input for receiving a transmitted signal from a communication channel;
a demodulator for extracting a plurality of signals from the transmitted signal; and
a decoder for:
  identifying a first test error pattern, having a weight, that covers at least one commonly located bit within each of a plurality of signals;
  applying the first test error pattern to each of the plurality of signals thereby generating first respective sets of possible signals, such that each one of the respective first sets of possible signals corresponding to a respective one of the plurality of signals;
  modifying the weight of the first test error pattern thereby generating a second test error pattern;
  applying the second test error pattern to each of the plurality of signals thereby generating second respective sets of possible signals, such that each one of the respective second sets of possible signals corresponding to a respective one of the plurality of signals; and
  for each of the plurality of signals, selecting a respective one possible signal from its respective first set of possible signals or its respective second set of possible signals as being an estimate thereof.

18. The apparatus of claim 17, wherein:
the decoder decoding each of the selected, respective one possible signals thereby generating a plurality of estimates of a plurality of information bits encoded within the transmitted signal.

19. The apparatus of claim 17, wherein:
the decoder performing partial decoding of plurality of signals before applying the first test error pattern or the second test error pattern thereto.

20. The apparatus of claim 17, wherein:
the plurality of signals being a plurality of orthogonal frequency division multiplexing (OFDM) symbols communicated in accordance with OFDM signaling.

21. The apparatus of claim 17, wherein:
the plurality of signals being a plurality of symbol sets each corresponding to a respective spreading code communicated in accordance with synchronous code division multiple access (S-CDMA) signaling.

22. The apparatus of claim 17, wherein:
for each of the plurality of signals, the decoder randomly selecting its respective one possible signal from its respective first set of possible signals or its respective second set of possible signals as being its respective estimate thereof.

23. The apparatus of claim 17, wherein:
for each of the plurality of signals, the decoder selecting its respective one possible signal based on its respective one possible signal having a smallest minimum distance among its respective first set of possible signals or its respective second set of possible signals.

24. The apparatus of claim 17, wherein:
the apparatus being a communication device that is operative within at least one of a satellite communication system, a wireless communication system, a wired communication system, and a fiber-optic communication system.

* * * * *